(12) United States Patent  
Kawahara et al.

(10) Patent No.: US 7,943,996 B2
(45) Date of Patent: May 17, 2011

(54) SEMICONDUCTOR DEVICE AND SEMICONDUCTOR INTEGRATED CIRCUIT USING THE SAME

(75) Inventors: Takayuki Kawahara, Higashiyamato (JP); Masanao Yamaoka, Kodaira (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/875,097

(22) Filed: Sep. 2, 2010

(65) Prior Publication Data

US 2010/0327356 A1 Dec. 30, 2010

Related U.S. Application Data

(63) Continuation of application No. 12/767,548, filed on Apr. 26, 2010, now Pat. No. 7,808,045, which is a continuation of application No. 11/492,054, filed on Jul. 25, 2006, now Pat. No. 7,732,864.

(30) Foreign Application Priority Data

Aug. 1, 2005 (JP) .................................. 2005-222708

(51) Int. Cl.
*H01L 23/62* (2006.01)
(52) U.S. Cl. .. 257/347; 257/206; 257/369; 257/E27.001
(58) Field of Classification Search .................. 257/206, 257/347, 369, E27.001
See application file for complete search history.

(56) References Cited

U.S. PATENT DOCUMENTS

| 6,040,610 | A | 3/2000 | Noguchi et al. |
| 2004/0155281 | A1 | 8/2004 | Osada et al. |
| 2006/0197111 | A1 | 9/2006 | Matsuzawa |

FOREIGN PATENT DOCUMENTS

| JP | 10-340998 A | 12/1998 |
| JP | 2000-131713 A | 5/2000 |
| JP | 2004-207694 A | 7/2004 |

OTHER PUBLICATIONS

Tadahiro Kuroda et al., "A 0.9-V, 150-MHz, 10-mW, 4mm$^2$, 2-D Discrete Cosine Transform Core Processor with Variable Threshold-Voltage (VT) Scheme", IEEE Journal of Solid-State Circuits, vol. 31, No. 11, Nov. 1996, pp. 1770-1779.

*Primary Examiner* — Tan N Tran
(74) *Attorney, Agent, or Firm* — Miles & Stockbridge P.C.

(57) ABSTRACT

The present invention provides a high speed and low power consumption LSI operable in a wide temperature range in which a MOS transistor having back gates is used specifically according to operating characteristics of a circuit.

In the LSI, an FD-SOI structure having an embedded oxide film layer is used and a lower semiconductor region of the embedded oxide film layer is used as a back gate. A voltage for back gates in the logic circuits having a small load in the logic circuit block is controlled in response to activation of the block from outside of the block. Transistors, in which the gate and the back gate are connected to each other, are used for the circuit generating the back gate driving signal, and logic circuits having a heavy load such as circuit block output section, and the back gates are directly controlled according to the gate input signal.

3 Claims, 29 Drawing Sheets

FIG.8

| POWER SUPPLY NAME | CASE 1 | CASE 2 |
|---|---|---|
| VCA(V) | 1 | 2 |
| VSA(V) | 0 | −1 |
| VCC(V) | 1 | 1 |
| VSC(V) | 0 | 0 |
| VCO(V) | 1 | 1 |
| VSO(V) | 0 | 0 |
| SGP(V) | 1/0 | 2/−1 |
| SGN(V) | 1/0 | 2/−1 |

FIG.17
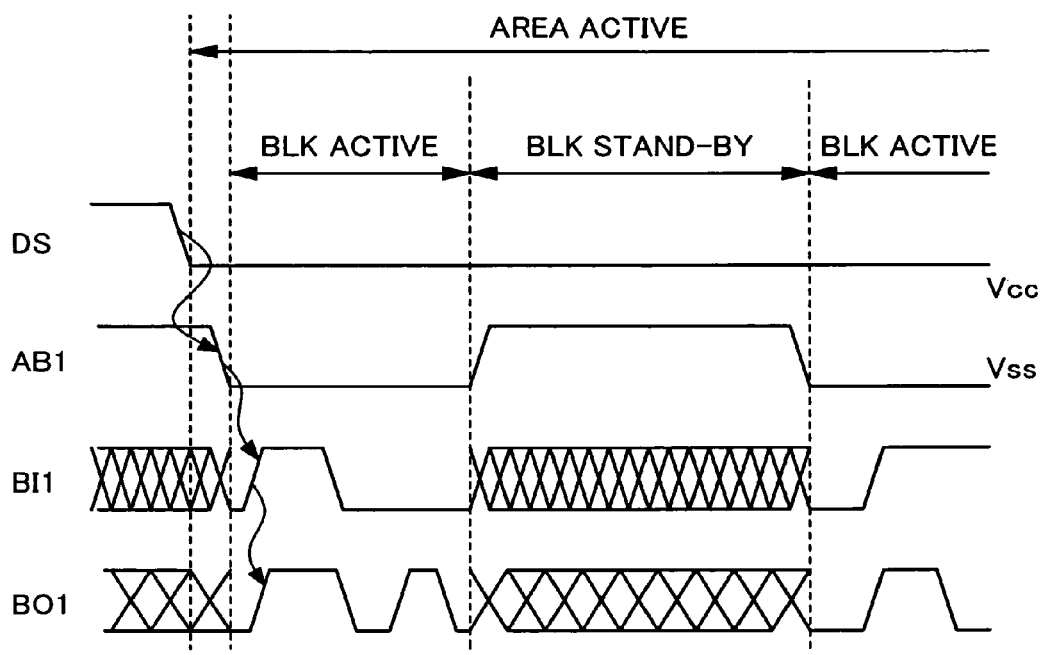
FIG.18A
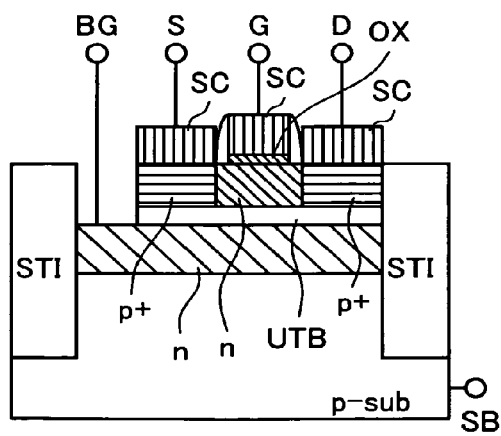
FIG.18B
| | MATERIAL |
|---|---|
| SC | NICKEL SILICIDE, TITANIUM NITRIDE, TANTALUM SILICON NITRIDE |
| TOX | ZIRCONIUM DIOXIDE, HALFNIUM OXIDE, TITANIUM DIOXIDE, TANTALUM PENTOXIDE |

TEMPERATURE

|Vth|@VCA=VCC, VSA=VSC

BLOCK LAYOUT EXAMPLE

SEMICONDUCTOR DEVICE AND SEMICONDUCTOR INTEGRATED CIRCUIT USING THE SAME

CROSS-REFERENCE TO RELATED APPLICATIONS

This application is a continuation of application Ser. No. 12/767,548 filed Apr. 26, 2010 now U.S. Pat. No. 7,808,045, which is a continuation of application Ser. No. 11/492,054 filed Jul. 25, 2006 now U.S. Pat. No. 7,732,864. The present application also claims priority from Japanese patent application JP 2005-222708 filed on Aug. 1, 2005 the content of which is hereby incorporated by reference into this application.

BACKGROUND OF THE INVENTION

1. Field of the Invention

The present invention relates to a semiconductor device requiring high speed performance and low power consumption, and more specifically to a technique which can effectively be applied to a low-lower processor circuit used in portable devices.

2. Description of the Related Art

Recently there have been strong needs for increasingly higher processing performance and lower power consumption in semiconductor, especially in those such as processors.

Higher processing performance of a semiconductor can generally be realized by lowering a threshold voltage. In a well-known method for lowering a threshold value, a voltage is applied to a MOS transistor substrate. In this technique, as disclosed, for instance, in "A 0.9-V, 150-MHz, 10-mW, 4 mm$^2$, 2-D Discrete Cosine Transform Core Processor with Variable Threshold-Voltage (VT) Scheme", Journal of Solid-State Circuits, IEEE, 1996, Vol. 31, No. 11, p. 1770-1779, a voltage is applied to a substrate (well) of a CMOS (Refer to FIG. 2 in the document) to change the current capability.

When a threshold voltage is lowered to improve the processing performance, however, a leakage current increases and power consumption disadvantageously increases in association with an increase in leakage current.

To simultaneously realize high processing performance and low power consumption, it is required to lower a threshold voltage and also to suppress an increase in leakage current. As a method of improving current capability of a MOS type transistor and at the same time lowering a leakage current, there is a technique for changing a voltage applied to a back gate in response to the operating state of the transistor. For instance, the following configuration is known in the art: A conductive light-shielding layer covered with an insulating layer is formed as a back gate under a thin film transistor forming pixels for a liquid crystal device. Current capability of the thin film transistor is changed by applying a voltage to the back gate. Thus, the current capability is improved when a signal voltage is written in a pixel and also a leakage current is suppressed after writing. Refer to Japanese Patent Laid-open No. 2000-131713.

Also a method is known in which high processing performance and low power consumption are realized in a circuit using a bulk type MOS transistor by controlling a voltage applied to the back gate in the active state and in the standby state. Refer to Japanese Patent Laid-open No. 10-340998.

SUMMARY OF THE INVENTION

However, in the method in which a bias voltage is applied to a substrate (well), generally there is a problem in that a leakage current from the MOS transistor increases (for instance, in a case of a processor for a 3-GHz PC configured with a CMOS transistor, the leakage current ranges as high as from 20 to 30 A per chip). In other words, there is a PN-junction between a source terminal or a drain terminal in each CMOS transistor and a substrate (well) terminal. For instance, in an nMOS transistor, the substrate is p-type and the source terminal is n-type. In the nMOS transistor, a positive voltage is applied to the substrate (well) for lowering a threshold value in the active state, but there is a limit in a range of the applicable voltage because the PN-junction turns ON. In particular, when temperature goes high, the range becomes narrower. For application to a low power processor, a limit value of a voltage that can be applied to a substrate (well) for its source is around 0.5 V at room temperature and around 0.2 V at a high temperature (for instance, 80° C.). In this case, since the effect is low and a leakage current due to a JN-junction is not negligible, it is difficult to suppress the leakage current to a target value. Also when 0 V and a negative voltage are switched, a change of a threshold voltage for a voltage to the substrate is rather small. Because of the restriction, large voltage amplitude is required to cause a desired change in the threshold voltage, and it is necessary to drive a large capacity with the voltage amplitude.

Furthermore, there is a method in which the back gate described in Patent document 1 described above is used for a device with an SOI structure not having a PN-junction between a substrate and a source nor between the substrate and a drain. This method needs a circuit for controlling a voltage applied to a back gate of each device according to an operating state of the device. However, element circuits constituting a system have a need for high processing performance and power saving to a different degree depending on its function. Therefore, the method in which a back gate voltage is applied to all devices constituting the circuit is not so effective for power saving in the entire system. Even when a voltage applied to each device is controlled independently, the circuit configuration becomes disadvantageously complicated.

In the circuit using a bulk type MOS transistor as described above, there is a problem in that a switch circuit for switching a voltage to be applied to a back gate is separately required.

To solve the problems described above, an object of the present invention is to provide a semiconductor device capable of realizing high processing performance and low power consumption by controlling a voltage applied to a back gate of a MOS device to reduce a threshold value and also to suppress a leakage current, and furthermore to provide a semiconductor device enabling independent use of a function of each circuit constituting a system according to the circuit function, without increasing the size of a circuit necessary to control a back gate.

The object of the present invention is realized by a semiconductor device comprising: a completely depleted type SOI/MOS transistor comprising: a first semiconductor layer formed on semiconductor substrate via an embedded oxide film; a source region and a drain region formed on the first semiconductor layer and having the same thickness as that of the first semiconductor layer; a channel region formed between the source region and the drain region; a first gate formed on a first main surface of the channel region; a second gate formed with a conductive layer on a bottom surface of the embedded oxide film; and an insulating separating layer formed on the semiconductor substrate so as to surround the first semiconductor layer; a first MOS transistor in which the first gate is electrically connected to the second gate; and a second MOS transistor in which the first gate and the second gate is controlled electrically independently of each other; wherein a first circuit comprising the first MOS transistor and a second circuit comprising the second MOS transistor are provided on the semiconductor substrate.

That is to say, the present invention uses a transistor having a completely depleted (FD) type SOI structure with a thin embedded oxide film (BOX) layer (with a thickness of, for instance, 30 nm or less). With the configuration, switching between a state in which a threshold value is high and a state in which a threshold value is low can dynamically performed by driving the back gate regarding the BOX layer as a gate insulating film. Since the BOX layer is present, a PN-junction like that in the conventional technology is not present, and a current due to the PN-junction does not flow.

A remarkable feature of the present invention consists in use of the combination of a MOS transistor in which the back gate is connected to the ordinary gate and a MOS transistor in which each of the back gate and the ordinary gate is independently driven. In the latter MOS transistor, back gates for a pMOS section are commonly connected in a preset circuit block, also back gates for an nMOS section are commonly connected, and the terminals are each controlled in response to activation of the circuit block (in the state where a logic operation is performed on an input signal and an output signal is outputted). The former MOS transistor is also used as a circuit driving a heavy load, a circuit driving back gates commonly connected in a circuit block using the latter MOS transistor, or a switch MOS provided between the circuit block and a power source.

Because of the configuration described above, high processing performance can be realized by driving the back gates to improve driving capability of MOS transistors. Furthermore, in the state where charging or discharging of an electric load is not being performed, a leakage current can be suppressed by driving the back gates into the reverse polarity. Thus the present invention realizes high processing performance and low power consumption.

With the present invention, semiconductor devices with high processing performance and low power consumption such as low-lower processors can be realized by suppressing an increase in circuit scale and also by reducing an increase in the area of a semiconductor chip.

BRIEF DESCRIPTION OF THE DRAWINGS

FIG. 8 illustrates examples of power voltages;

FIG. 17 illustrates an operational example of operations in FIG. 16;

FIGS. 18A and 18B illustrate a material for a gate electrode and a material for a gate insulating film;

DETAILED DESCRIPTION OF THE PREFERRED EMBODIMENTS

Preferred embodiments of the present invention will be described below with reference to the accompanying drawings.

First Embodiment

Figure 1:
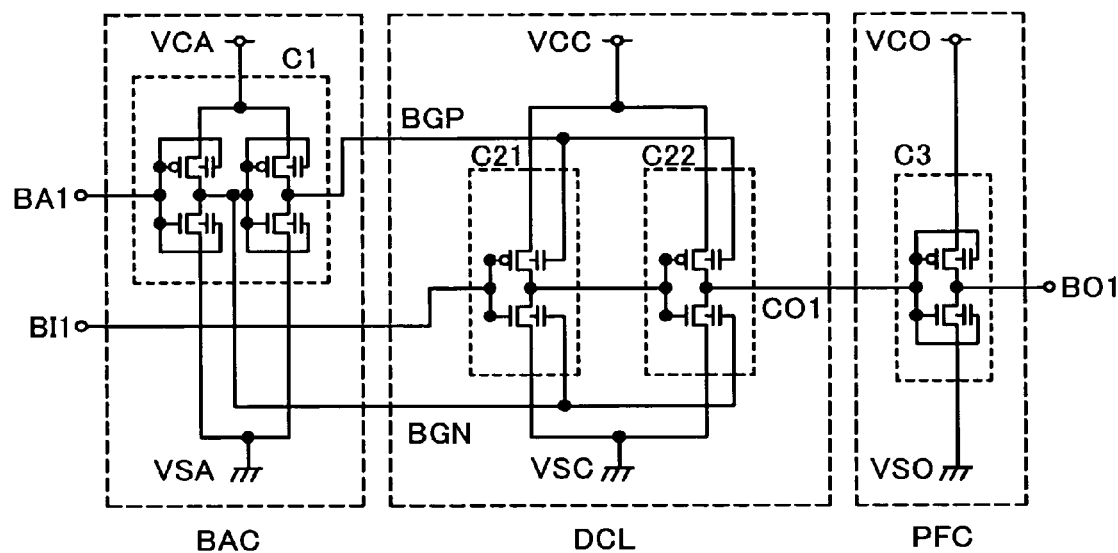
FIG. 1 illustrates a first embodiment of the present invention.

FIG. 1 illustrates a first embodiment of the present invention.

The circuit shown in FIG. 1 is largely classified to three blocks. A block DCL is a logic circuit block, a BAC block is a circuit for controlling a back gate of the Block DCL, and a PFC block is a circuit for driving an output terminal BO1 generally having a heavy load.

The DCL block is an example of a logic circuit with inverter circuits in two stages. Sign BI1 denotes an input to the DCL block and CO1 denotes an output from the DCL block. Sign VCC denotes a power voltage and sign VSC denotes the ground voltage. The signs C21 and C22 denote inverter circuits respectively, and BI1 denotes the input to the inverter circuit C21. An output from the inverter circuit C21 is provided as an input to the inverter circuit 22, and CO1 denotes an output terminal of the inverter circuit C22. In this logic circuit block DCL, namely in the two stages of inverter circuits in FIG. 1, a CMOS transistor constituting the logic circuit has a back gate which can be controlled from the outside (namely from outside the logic circuit block). In FIG. 1, a back gate of the pMOS transistor in each of the inverter circuits C21 and C22 is denoted as BGP in the abbreviated form, and a back gate in the nMOS transistor as BGN. With the configuration described above, a voltage application to the back gate can be changed according to an operating mode or an operating state of this logic circuit. By changing a voltage applied to the back gate, a threshold voltage can be changed in each of the nMOS and pMOS transistors. Because of this feature, by changing a signal voltage generated in each of the back gates BGP and BGN, a state where the threshold value is high is provided by changing the back gate voltage to reduce a leakage current. On the contrary, when the logic circuit is operating, a state where the threshold value is low is produced by changing the back gate voltage to acquire a large driving circuit.

Sign BAC is a circuit generating voltages to the back gates BGP and BGN, and in FIG. 1, the circuit is denoted by sign C1 in which there are two inverters arranged in two stages and the gates and back gates are connected directly to each other. Sign VCA denotes a power voltage, and sign VSA denotes the ground voltage. Sign BA1 denotes an input signal, and the back gates BGP and BGN are switched according to this signal, and because of this mechanism, a threshold voltage for each of the nMOS and pMOS transistors included in the circuit DCL.

A block PFC is a circuit for receiving the output CO1 from the logic circuit block DCL and driving a terminal BO1 having a heavy load such as long wiring. In FIG. 1, the circuit is denoted by sign C3, and the circuit C3 is formed with one inverter in which the gate and the back gate are directly connected to each other, but the number of stages varies according to a load for the terminal BO1. Sign VCO denotes a power voltage, while sign VSO denotes the ground voltage.

In the three circuit components described above, potentials of the power voltages VCA, VCC, and VCO may be equal to or different from each other. Even when the potentials are equal to each other, in an actual layout of an LSI chip, wiring for power supply may be provided from each of the voltages VCA, VCC, and VCO from a pad connected to an external power source. The voltages VCA, VCC, and VCO are, for instance, 1 V. Voltages VSC, VSA, and VSO are ground voltages, which may be different from each other. A negative voltage is also allowable.

In the embodiment described above, since threshold voltages for an nMOS transistor and a pMOS transistor in the block DCL can be changed, a preferred threshold voltage can be selected in the block DCL according to the operational state of the block DCL. Because of this feature, a threshold voltage can beset to a small absolute value when high speed processing is required, and to a large absolute value when the processing speed may be low, or in the standby state, thereby suppressing a leakage value. Thus high processing performance and low power consumption can be achieved.

Figure 2:
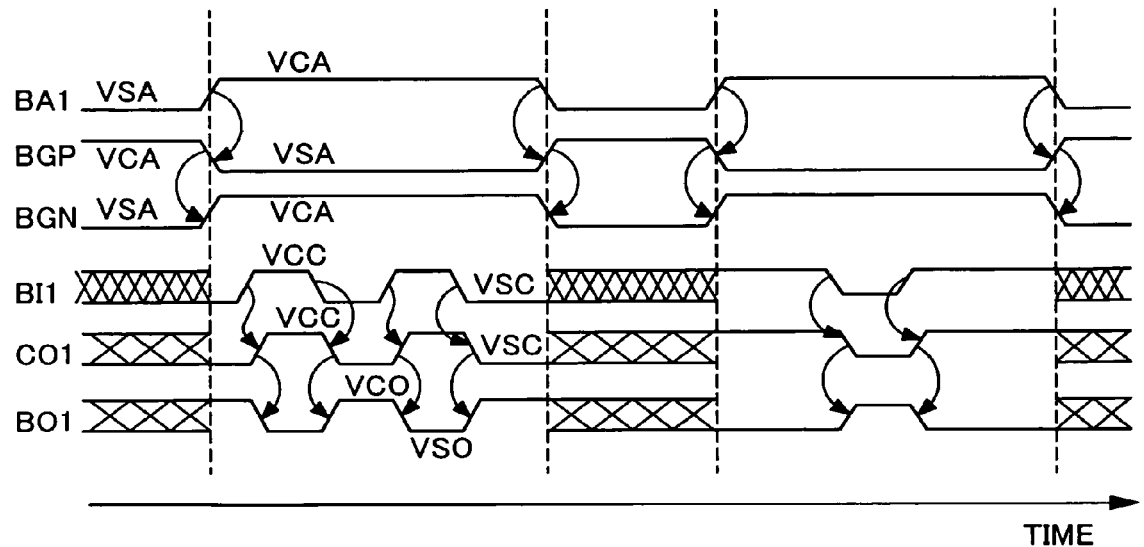
FIG. 2 illustrates an operational example in the first embodiment shown in FIG. 1.

FIG. 2 illustrates an example of operations in the configuration shown in FIG. 1. Sign BA1 denotes a signal for indicating whether the block DCL is activated or not, namely whether a state of the block DCL should be changed or not, and BGP and BGN denote control signals to the block DCL generated in response to the signal BA1. Sign BI1 denotes an input signal to the logic circuit block DCL, and sign BO1 denotes a signal obtained by subjecting the output CO1 from the block DCL to current amplification in block PFC. A voltage level of the signal BA1 when the block DCL is not activated is a low voltage level denoted by the sign VSA, and a voltage level of the signal BA1 when the block DCL is activated is a high voltage level VCA.

In the initial state in which the block DCL is in the standby state, the signal BA1 is at a low voltage level VSA. Thus, in the circuit BAC, the back gate BGP is set at a voltage level VCA and the back gate BGN at a voltage level VSA by the inverters in the two stages. Therefore, in the block DCL, in both of the pMOS and nMOS transistors, the threshold values are set to high values, thus a leakage current being suppressed to a low level.

To activate the block DCL, at first the signal BA1 is switched from the level VSA to the level VCA. Because of switching of the signal BA1, the control signals BGP and BGN are switched by the inverters in the two stages in the BAC circuit. At the control signal BGP controlling a back gate of the pMOS transistor in the block DCL, the signal is switched from the high level VCA to the lower level VSA, and at the control signal BGN controlling the back gate of the nMOS transistor, the signal is switched from the low level VSA to the high level VCA. Because of the signal switching described above, a threshold voltage can be set at a low value in both of the pMOS transistor and the nMOS transistor in the block DCL, and operations can be executed at high speeds. Signals inputted after this step from the input BI1 to the block DCL are enabled one, and logic operations are performed in the block DCL in response to the signals. In the case shown in FIG. 1, the logic operations are executed in the two-stage inverters. The configuration is employed for simplifying the descriptions, and there may be other logic circuits such as NAND or NOR, and furthermore there are a plurality of inputs BI1. A result of the logic operation is outputted to the output terminal CO1 shown in FIG. 1, increases the driving force in the PFC block, an output buffer, and is outputted to the terminal BO1. The input signal BA1 inputted to the block BAC is generated outside the block shown in FIG. 1. Specifically, the signals are generated in a circuit block provided in the upstream from the former stage of the circuit block shown in FIG. 1, or a circuit block prepared for controlling various circuit blocks. Alternatively a circuit for monitoring a state of the input signal BA1 is separately provided to produce the signals therein. Furthermore the signals may be inputted from an external device.

After the logic operation in the block DCL is finished, when the circuit is to be inactivated, the signal BA1 is again switched to the voltage level VSA. Upon receipt of the signal, the block BAC is activated, the control signal BGP is set at the level VCA and the control signal BGN at the level VSA. When this signal is inputted to back gates of the pMOS and nMOS transistors in the block DCL, threshold voltages for the MOS transistors again go high. With this operation, the block DCL is again set in the inactivated state.

By executing the operations as described above, high processing performance, low power consumption, and suppression of a leakage current are realized in this embodiment.

Figure 3A:
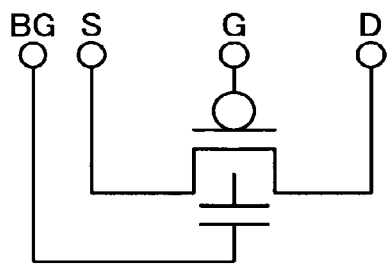
FIGS. 3A and 3B are a circuit diagram and a cross-sectional view, respectively, illustrating an example of a pMOS.
Figure 3B:
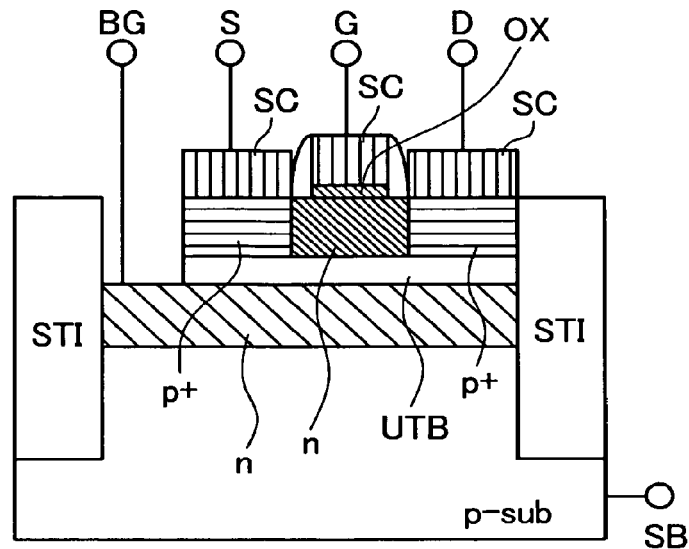

An example of a structure of the MOS transistor for executing the operations will be described below. FIGS. 3A and 3B are a circuit diagram and a cross-sectional view, respectively, illustrating an example of the structure of a pMOS transistor, in which the terminals in the figures are associated with each other.

An example of a structure of the MOS transistor for executing the operations will be described below. FIG. 3A is a circuit diagram, and FIG. 3B is a cross-sectional view, and the same terminals have the same terminal names between them.

In FIG. 3B, sign p-sub denotes a substrate, SB denotes the terminal of the substrate, STI denotes a trench isolation region, and UTB denotes an embedded oxide film. The thickness of the embedded oxide film USB is, for instance, in the range from 10 to 20 nm. On this embedded oxide film UTB, a MOS transistor is formed. Signs S, G, and D denote source, gate, and drain terminals, respectively, and are connected to a P+ region (source), an n region (channel forming region), and a p+ region (drain), respectively, via silicide SC. The thickness is, for instance, approximately 20 nm. An oxide film OX is placed between the silicide SC of the gate and the n region to configure the so-called MOS structure. The oxide film may sometimes use the so-called a High-K film such as the hafnium oxide. In addition, the gate is made of silicide such as NISI. Other metal materials may be applicable. Under the oxide film UTB, the n-region is placed and connected to the terminal BG. Therefore, as illustrated in FIG. 3B, the terminal BG is connected to the n region via a capacitor with the oxide film UTB placed therebetween as an insulation film. In this configuration, when the oxide film UTB is regarded as a second gate oxide film, there exists a second gate behind the MOS structure. Therefore, this second gate will below be referred to as a back gate. FIG. 1 is a sample circuit having the configuration described above. When a voltage is applied to the substrate p-sub so that the forward voltage should not be applied between the n region connected to the terminal BG and the p region of the substrate p-sub connected to the terminal SB, it is possible to apply a certain voltage to the terminal BG within the range described above to change the threshold voltage of the MOS transistor placed on the oxide film UTB. In the configuration described above, when the thickness of the channel forming region is approximately 20 nm as described in the above example, the semiconductor region (channel region) under the gate placed between the source terminal and the drain terminal becomes fully depleted. When the thickness of the oxide film UTB is not limited, the structure having a fully-depleted channel region on the insulating film UTB like above is generally referred to as the FD-SOI structure.

Figure 4A:
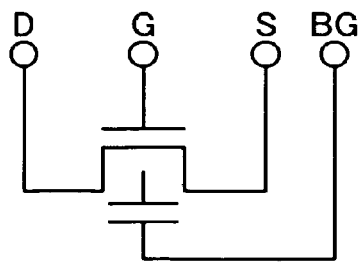
FIGS. 4A and 4B are a circuit diagram and a cross-sectional view, respectively, illustrating an example of an nMOS.
Figure 4B:
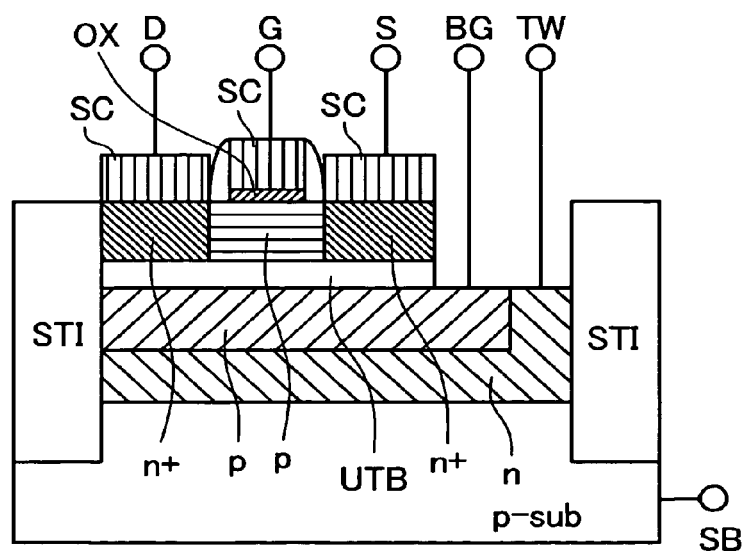

FIG. 4 illustrates a structure of the nMOS transistor. Detailed explanation of the structure is omitted herein because it is much the same as the structure of the pMOS transistor in FIG. 3 except that the p-type and n-type portions are replaced by each other. A MOS transistor is formed on the embedded oxide film UTB so as to have a gate comprising silicide and the source and drain each comprising an n+ region and silicide. In the example shown in FIG. 4, to exercise control with a terminal TW, an n region is placed between the p-area connected to the terminal BG, and the substrate p-sub (connected to the terminal SB) which is another p-region in which the carrier density is generally lower than that of the p-area connected to the terminal BG. The n-region is placed so as to electrically insulate the p-region connected to the terminal BG from the substrate p-sub (connected to the terminal SB) which is another p-region. The electric potential (voltage) of the terminal BG is changed as described above with reference to FIGS. 1 and 2. Even if the potential is applied to the terminal BG, it is possible to apply certain electric potential (voltage) to the terminal TW to produce a reverse voltage to the pn junction between the p-region connected to the terminal BG and the n-region connected to the terminal TW so that the electrical insulation between the p-region connected to the terminal BG and the substrate p-sub (connected to the terminal SB) is made possible. FIGS. 3 and 4 illustrate pMOS and nMOS transistors, respectively, in a separate manner. In practice, however, both nMOS and pMOS are formed on one and the same substrate p-sub.

FIGS. 5A, 5B, 6A and 6B illustrate examples when voltages are applied to the back gate (BG).

Figure 5A:
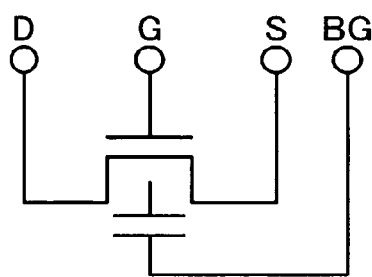
FIGS. 5A and 5B are a circuit diagram and a graph, respectively, illustrating characteristics of the nMOS.
Figure 5B:
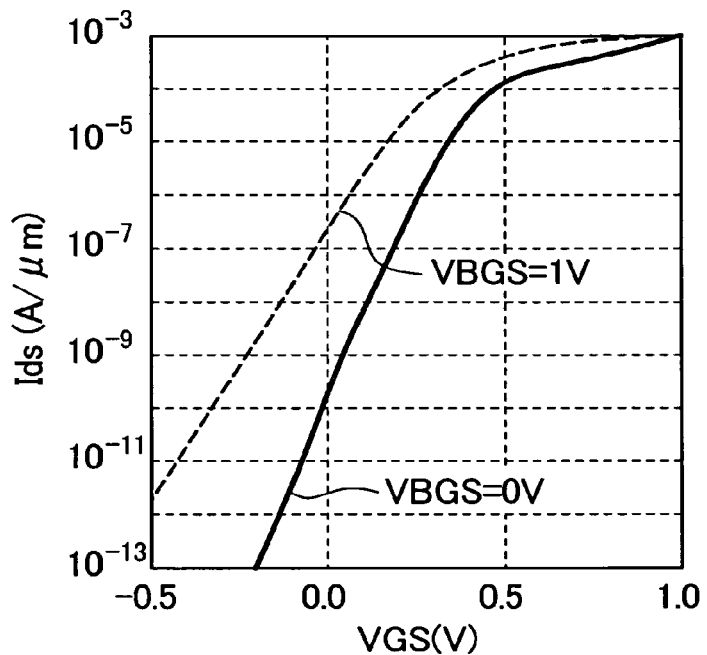

FIG. 5A is a circuit diagram, and FIG. 5B is a graph illustrating dependency of the drain current IDS when the voltage VBGS of the back gage BG is changed, on voltage VGS between a gate and a source. FIG. 5B shows the following: If the voltage VGS between the gate and the source is 0 V (or OFF state), the leakage current value is $10^{-10}$ ampere per 1 micron meter of the gate width when the BG voltage VBGS is 0 V, while, when the BG voltage VBGS is 1 V, the current value is more than one thousand times as high as the leakage current. It may be difficult to read data correctly because the vertical axis is plotted with logarithm, but, if the VGS is 1 V (or ON current state), the current value when the VBGS is 1 V is approximately 20% larger than the current value when the voltage VBGS is 0 V. Thus, if the voltage VGS between the gate and the source is constant, different current values can be obtained by changing the back gate voltage VBG. Therefore, as described above with reference to FIGS. 1 and 2, it is possible to create the state in which the leakage current is small or the state in which the ON current is larger in the circuit block DCL according to the necessity.

Figure 6A:
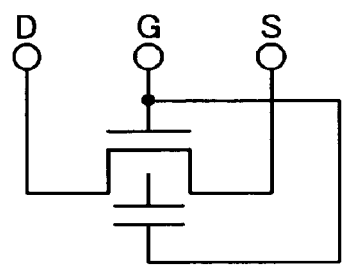
FIGS. 6A and 6B are a circuit diagram and a graph, respectively, illustrating characteristics of the nMOS when a gate and a back gate are connected to each other.
Figure 6B:
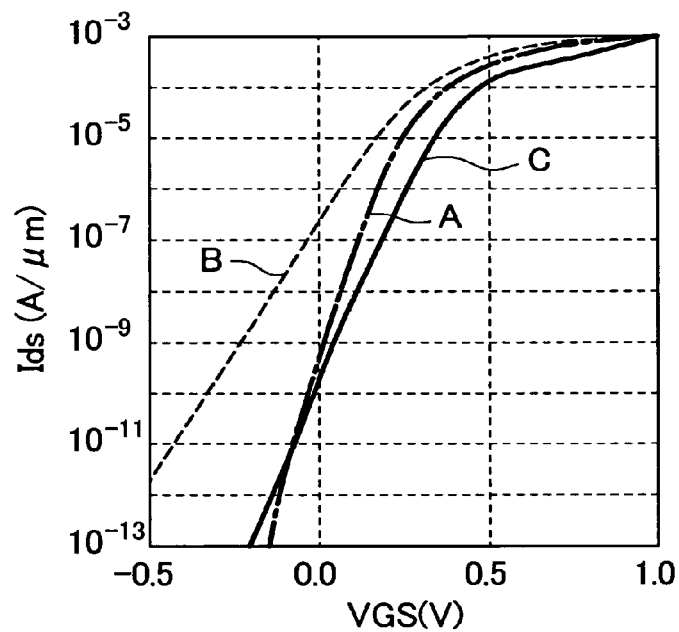

FIG. 6A shows a circuit diagram in which the back gate and the gate are directly connected to each other, and FIG. 6B is a graph illustrating dependency of drain current IDS when the circuit is driven by the gate G voltage only, on the voltage VGS between the gate and the source. In FIG. 6B, line A represents the dependency, line B represents the dependency when the voltage VBGS is 1 V, and line C represents the dependency when the voltage VBGS is 0 V. As described above, a small leakage current is realized when the voltage VGS is 0 V (OFF state), and a large ON current is realized when the voltage VGS is 1 V. Thus, the high processing performance, low power consumption, and a low leakage current can be realized using the circuit blocks BAR and PFC.

With the invention, to control a block of a logic circuit such as the block DCL illustrated in FIG. 1, the back gate BG is used independently to control it as illustrated in FIGS. 5A and 5B. Generally, a system LSI have many circuit blocks, but not all circuit blocks always work, and some circuit blocks are working and the working circuit blocks change as time goes on. Thus, it is possible to realize high processing performance, lower power consumption, and low leakage current by setting only activated circuit blocks in the state in which the ON current is high and also setting the inactive circuit blocks in the state where the OFF current is very small. In addition, since the back gate drives the circuit blocks externally, each circuit in the block DCL will not drive the back gate while those circuits work. The wiring lines in the circuit blocks are so short that the loads for driving each circuit are determined mostly by the gate capacity. Therefore, it is important to prevent an increase in gate capacity, which is achieved in the present invention. On the other hand, the circuit block BAC in FIG. 1 is a circuit which judges whether or not to activate the circuit block DCL, and the back gate should drive in the circuit. Generally, activation processes are done in a batch of unit time, so that the block BAC is required to be driven only in the beginning and at the end of the period. At the same time, the block BAC should always be ready for receiving the signal to change the state to the activated state any time. Therefore, wiring connections in FIG. 6 is used because the control is very simple. Since the circuit block PFC drives a heavy load, the influence caused by the increase in gate capacity becomes small. Therefore, the same control method illustrated in FIGS. 6A and 6B is employed.

A description is provided above for the FD-SOI structure including a thin-film BOX layer, and the combination of a first transistor in which the gate and the back gate are connected to each other and a second transistor in which the back gate voltage applied thereto is changed between when operated and standing-by. In the structure, the second transistor may be applied to the block having light load in a logic circuit and the back gate of those blocks may commonly be connected for control when those blocks are activated. In addition, the first transistor may be applied to the logic circuits having a heavy load such as the circuit for activating the blocks and the output section of circuit blocks, and the back gate of the transistor is directly controlled according to the gate input signal. With the configuration described above, high processing performance, low power consumption and low leakage currents can be realized.

Second Embodiment

The DCL shown in FIG. 1 is a logic circuit block as described above, and is activated by the circuit BAC and executes computing operations. Another example is shown in FIG. 7.

Figure 7:
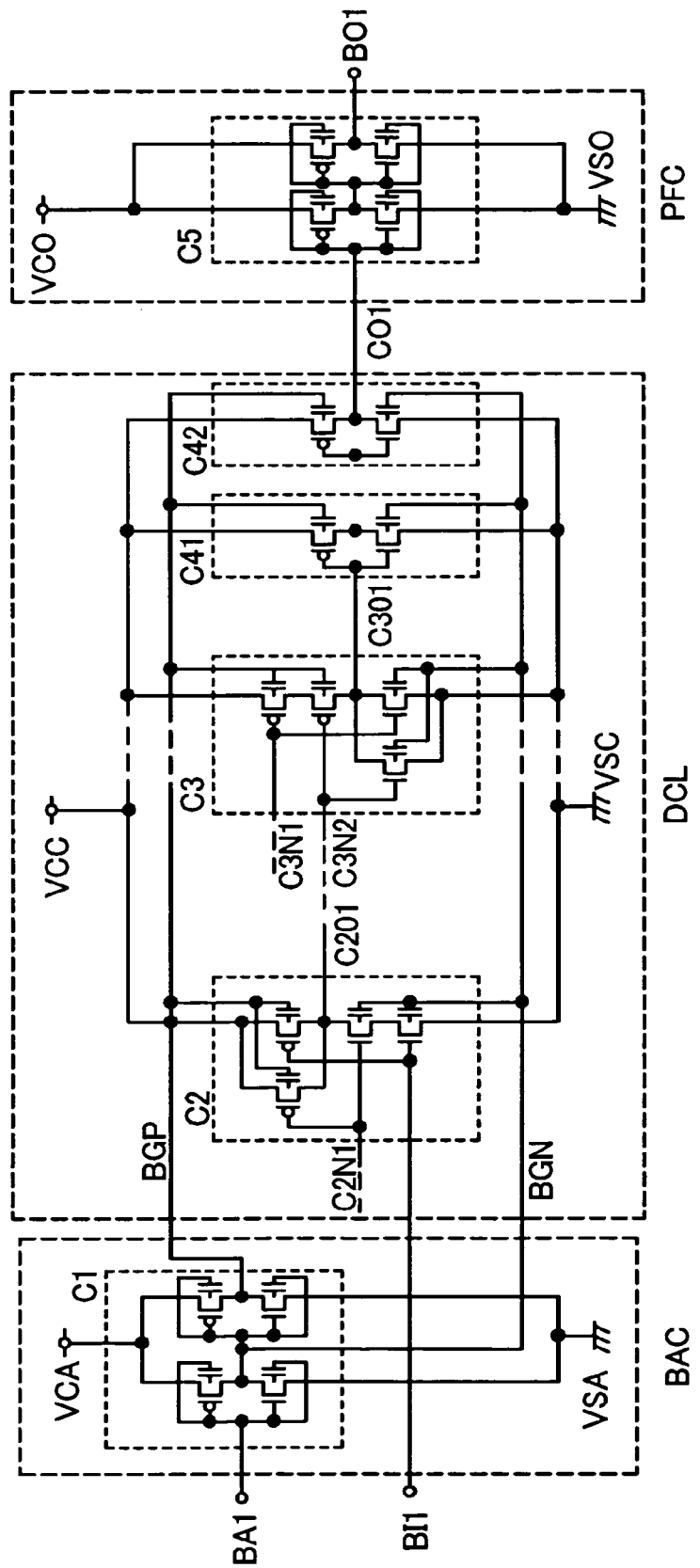
FIG. 7 is a circuit diagram illustrating a second embodiment of the present invention.

The DCL shown in FIG. 7 includes a NAND circuit C2 and a NOR circuit C3. In both of the circuits, back gates of each pMOS transistor are generically denoted by sign BGP, and back gates of each nMOS transistor are generically denoted by sign BGN. Generally, an input terminal for inputting a signal from outside the DCL is only the input terminal BI1. However, there may be another terminal for inputting a signal from outside the DCL. Although a terminal C2N1 and a terminal C3N1 is not shown in the figure, the terminals are connected to output terminals of other circuit in the DCL, and received signals outputted from the terminals. The block PFC includes inverters provided in two stages. Like the case shown in FIG. 1, in the blocks BAC and PFC, the gates and the back gates are connected directly.

FIG. 8 illustrates of an example of a power voltage. In case 1, a single power voltage (excluding a ground voltage of 0 V, according to the usual procedure) is used. Namely, voltages VCA, VCC, and VSC are 1 V, while voltages VSA, VSC, and VSO are 0 V. In this configuration, the voltages SGP and SGN are 0 V or 1 V. Although the voltage configuration is simple as described above, the threshold voltage can be changed as described in FIG. 5 or FIG. 6 when the present invention is used. As a result, an OFF current during the standby state can be suppressed to a very low level while an ON current during operations is large. As shown in FIG. 3 and FIG. 4, a thickness of the embedded oxide film UTB is in the range from 10 to 20 nm, and a complete depletion type SO1 MOS transistor is used. A material for the gate is NiSi. In this configuration, it is also possible to make the ON current further larger and suppress the OFF current to a further lower level simultaneously as shown in case 2. This is characterized in that the voltage VCA is 2 V and voltage VSA is −1 V with respect to a power for the block BAC shown in FIG. 1 and FIG. 7. This enables the amplitude of the back gate to become larger. In the case of the nMOS transistor, for example, by applying a voltage of 2 V to the back gate instead of a voltage of 1 V, the ON current increases. On the contrary, by applying a voltage of −1 V instead of a voltage of 0 V, the OFF current decreases. Although not shown in the figure, appropriate values may be selected for the voltage TW and SB shown in FIG. 3 and FIG. 4.

Third Embodiment

Figure 9:
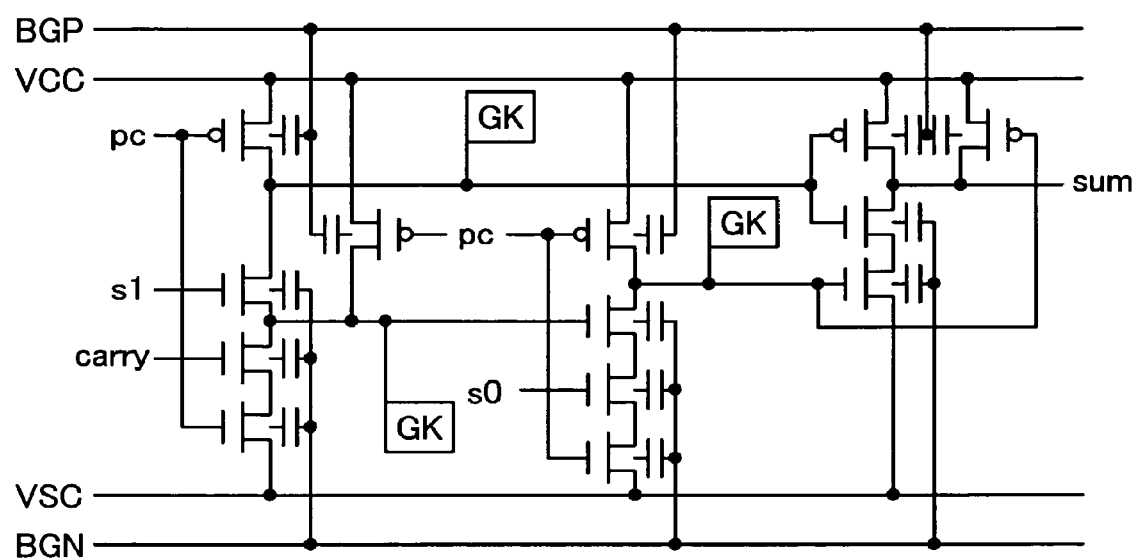
FIG. 9 is a circuit diagram illustrating a third embodiment of the present invention.

FIG. 9 illustrates an example of another logic circuit used in the DCL. Signs pc, carry, s, s1, and SUM denote an input/output signal. Back gates of the pMOS transistor are connected to the BGP terminal. Back gates of each nMOS transistor are connected to the BGN terminal. In this embodiment, circuits GK are provided at some nodes in the block. The circuits GK are latch circuits for retaining signals. The latch circuit is used to stabilize a signal level at nodes connected during the standby state. In the activated state, a drive current should be weak so that a current actually driving the nodes will not be impeded.

Fourth Embodiment

Figure 10:
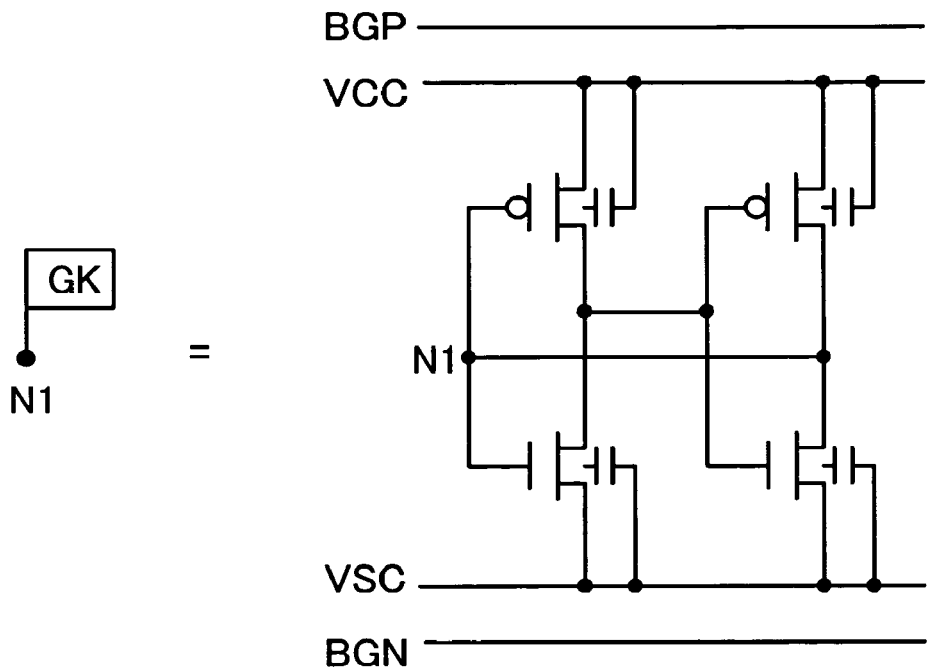
FIG. 10 is a circuit diagram illustrating a fourth embodiment of the present invention.
Figure 11:
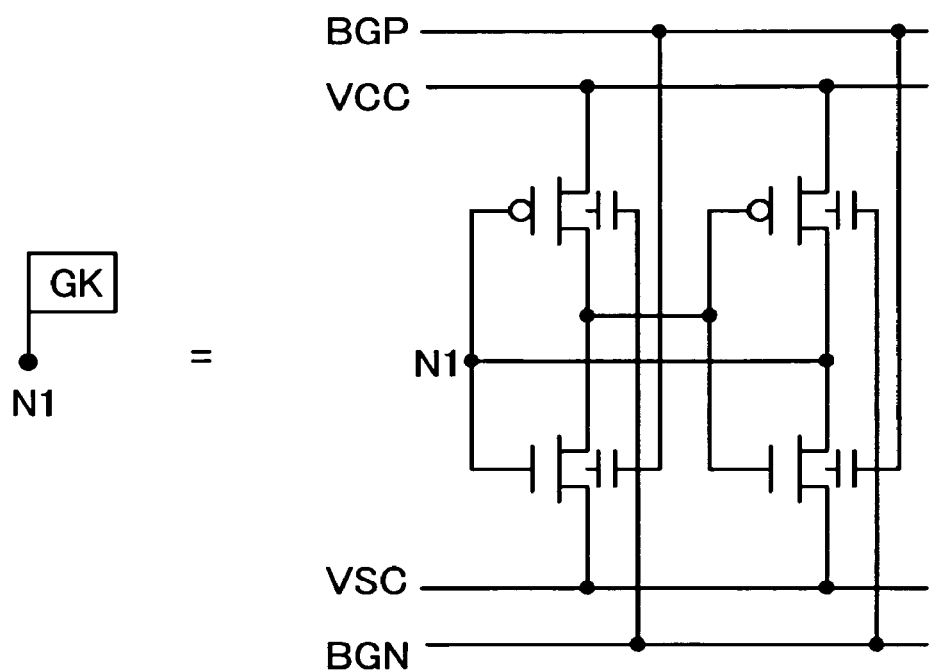
FIG. 11 is a circuit diagram illustrating a fifth embodiment of the present invention.

Examples of the case described above are shown in FIG. 10 and FIG. 11. In these examples, each output terminal is connected with input terminals. In the example shown in FIG. 10, the back gates are connected with the power supply. The back gates of the pMOS transistors are connected to the power voltage VCC. The back gates of the nMOS transistors are connected to the power voltage VSC. With the connection described above, by setting a driving force of the latch circuit to a level at which operations of other circuits are not impeded when the circuit block is activated, the driving force is not decreased even if the circuit block is in the inactivation or standby state. This feature is different from those of other circuits in which back gates are connected to a voltage SGP and SGN. In the embodiment shown in FIG. 11, the latch circuit keeps the driving force enough to retain the level in the standby state and can change the driving force to a level at which operations of other circuits are not impeded in the activated state. In other words, unlike the cases described above, the back gates of the pMOS transistors are connected to the voltage BGN, and the back gates of the nMOS transistors are connected to the voltage BGP. With this connection, in the case of the nMOS transistor, for example, the back gates are at a low level during operations, so that the ON current is small. In the standby state, a high voltage is applied to the back gates, so that the ON current is large and the voltage is kept at the level in the stable state.

Figure 12A:
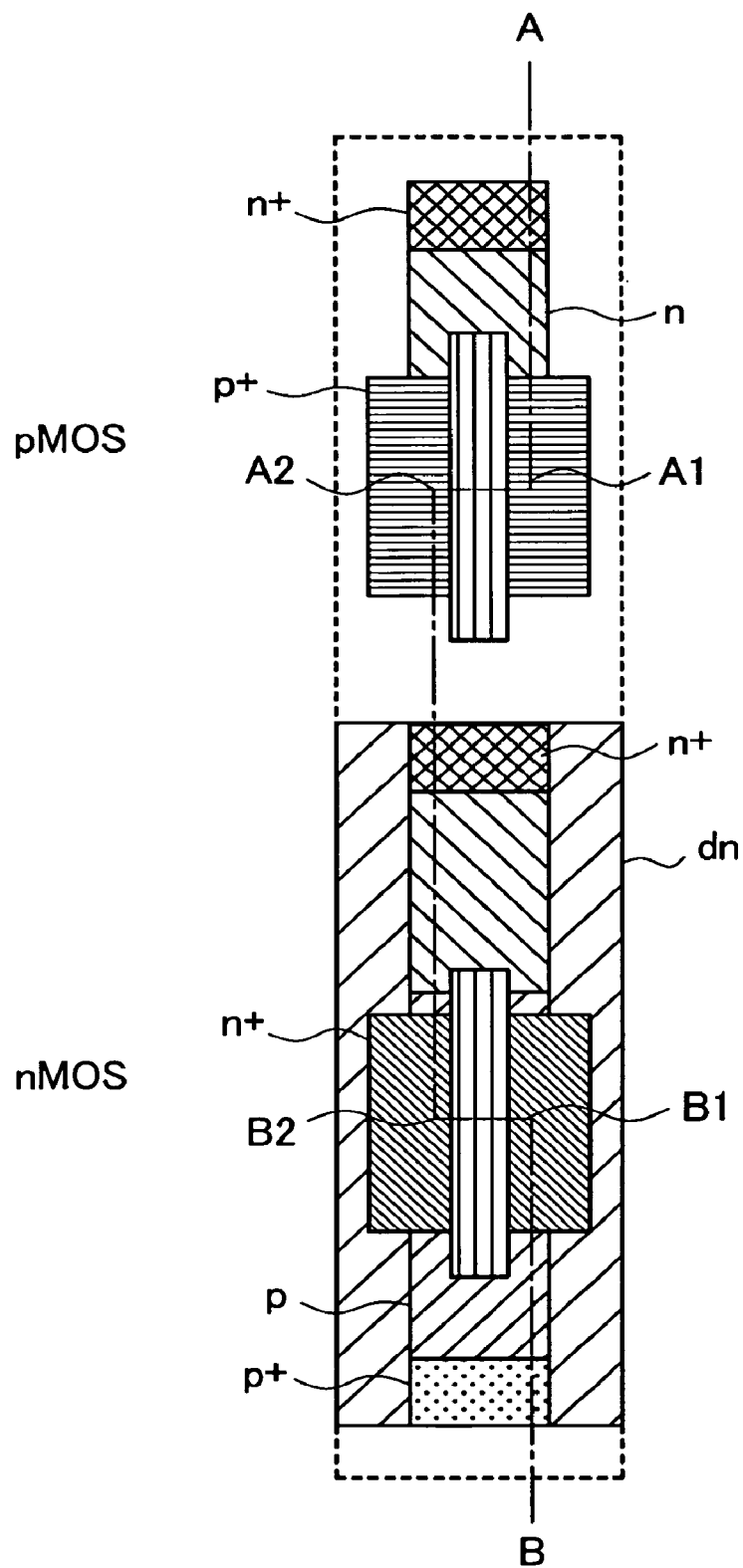
FIG. 12A is a plan view illustrating an example of a CMOS according to the present invention.
Figure 12B:
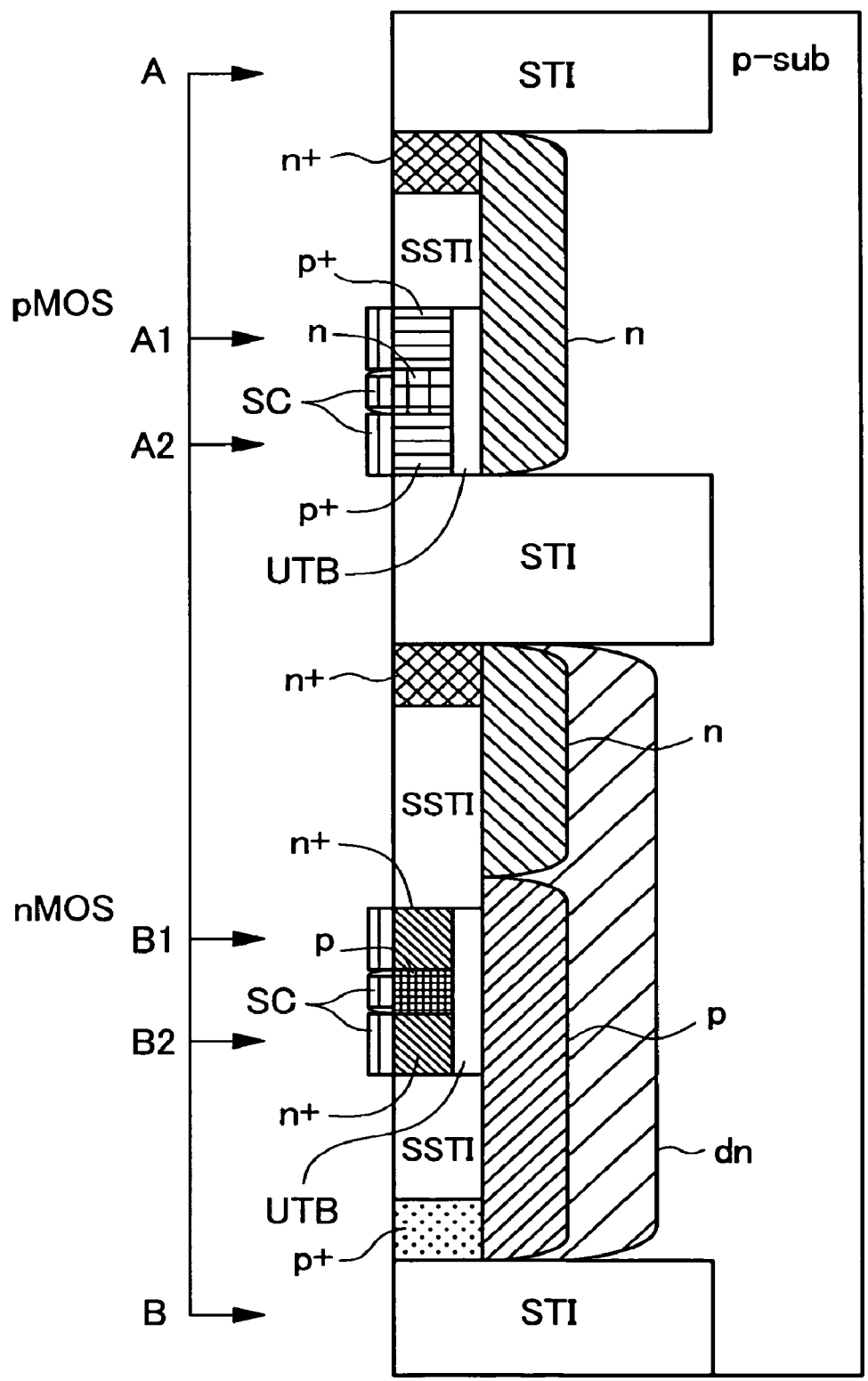
FIG. 12B is a cross section taken along line A-A1-A2-B2-B1-B in FIG. 12A.

FIG. 12A and FIG. 12B are views each showing an example of the CMOS structure of the present invention. FIG. 12A is a flat view. FIG. 12B is a cross section taken along the line A-A1-A2-B2-B1-B. Each of the nMOS and pMOS transistors has a p-substrate structure described above and below. The two transistors are separated from each other by a trench type insulating region ST1. With respect to the pMOS transistor, a structure on the embedded oxide film UTB is the same as that on the oxide film UTB shown in FIG. 3. An n-region is provided under the oxide film UTB, and functions as a back gate. The back gate is led out up to a surface of the semiconductor through an n+ region. A separation region, between the n+ lead-out region and the pMOS portion including the oxide film UTB is a trench type insulation region ST1 with a smaller depth than that of the region ST1. With respect to the nMOS transistor, a structure on the embedded oxide film UTB is the same as that of the oxide film UTB shown in FIG. 4. A p-region is provided under the oxide film UTB, and functions as a back gate. This back gate is led out up to a surface of the semiconductor through a p+ region. A separation region between the p+ lead-out region and the nMOS portion including the oxide film UTB is a trench type insulation region ST1 with a smaller depth than that of the region ST1. Furthermore, a do region, which is an n-type semiconductor, is provided between the p region under the oxide film UTB and the p-substrate which is a p-type semiconductor. This dn region is led out up to a surface of the semiconductor through the n region provided under the SSTI region and the n+ region. The region STI is provided to separate the nMOS transistor from the pMOS transistor in this configuration as described above. Also, the ST1 is provided to separate the dn region from the n region which is a back gate region for the pMOS transistor. With this configuration, a threshold value can be changed according to the operating state of the circuit, enabling a semiconductor device with high speed processing, low power consumption and a low leakage current.

Figure 13:
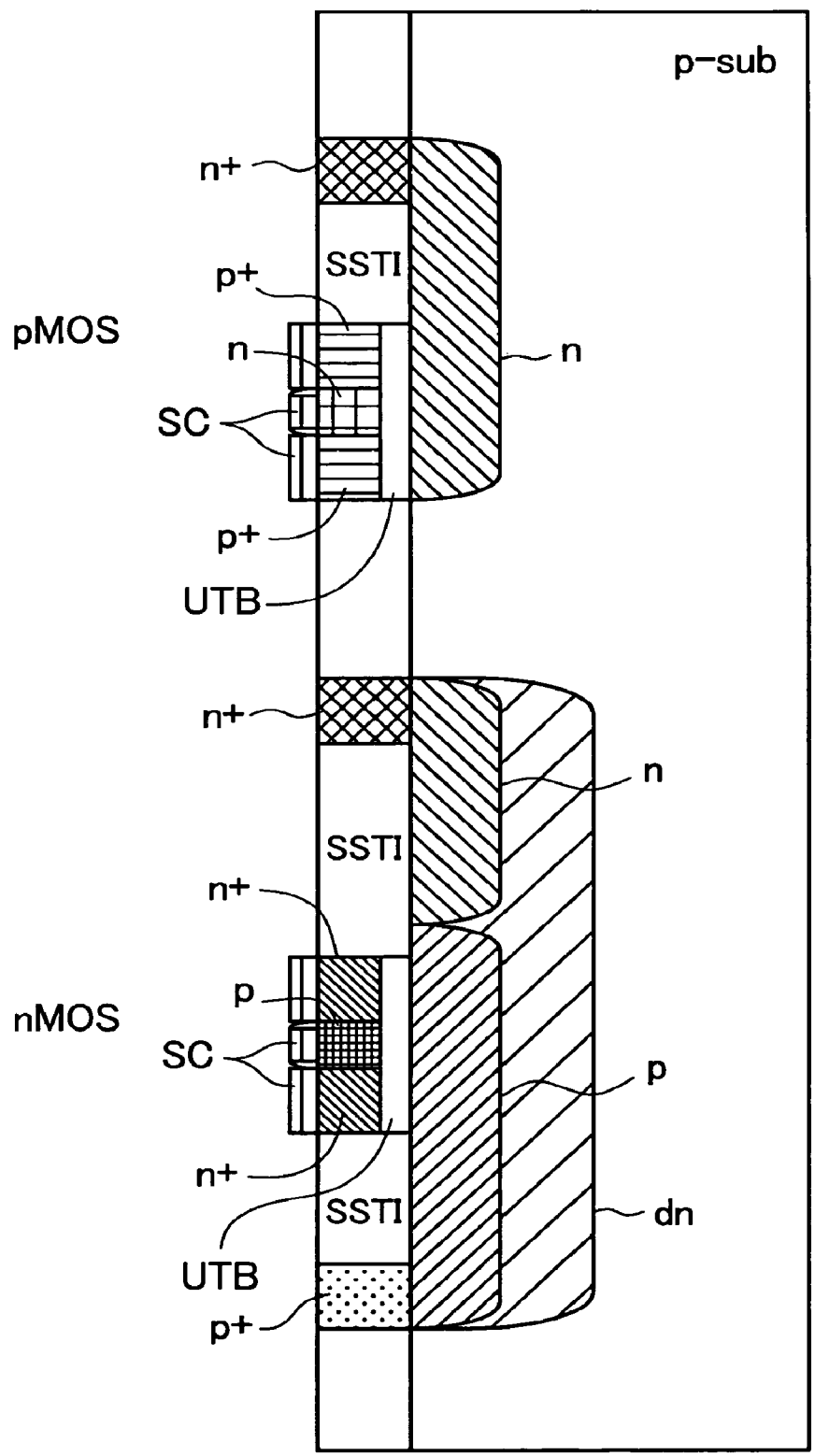
FIG. 13 is a cross-sectional view illustrating an example of the CMOS.
Figure 14:
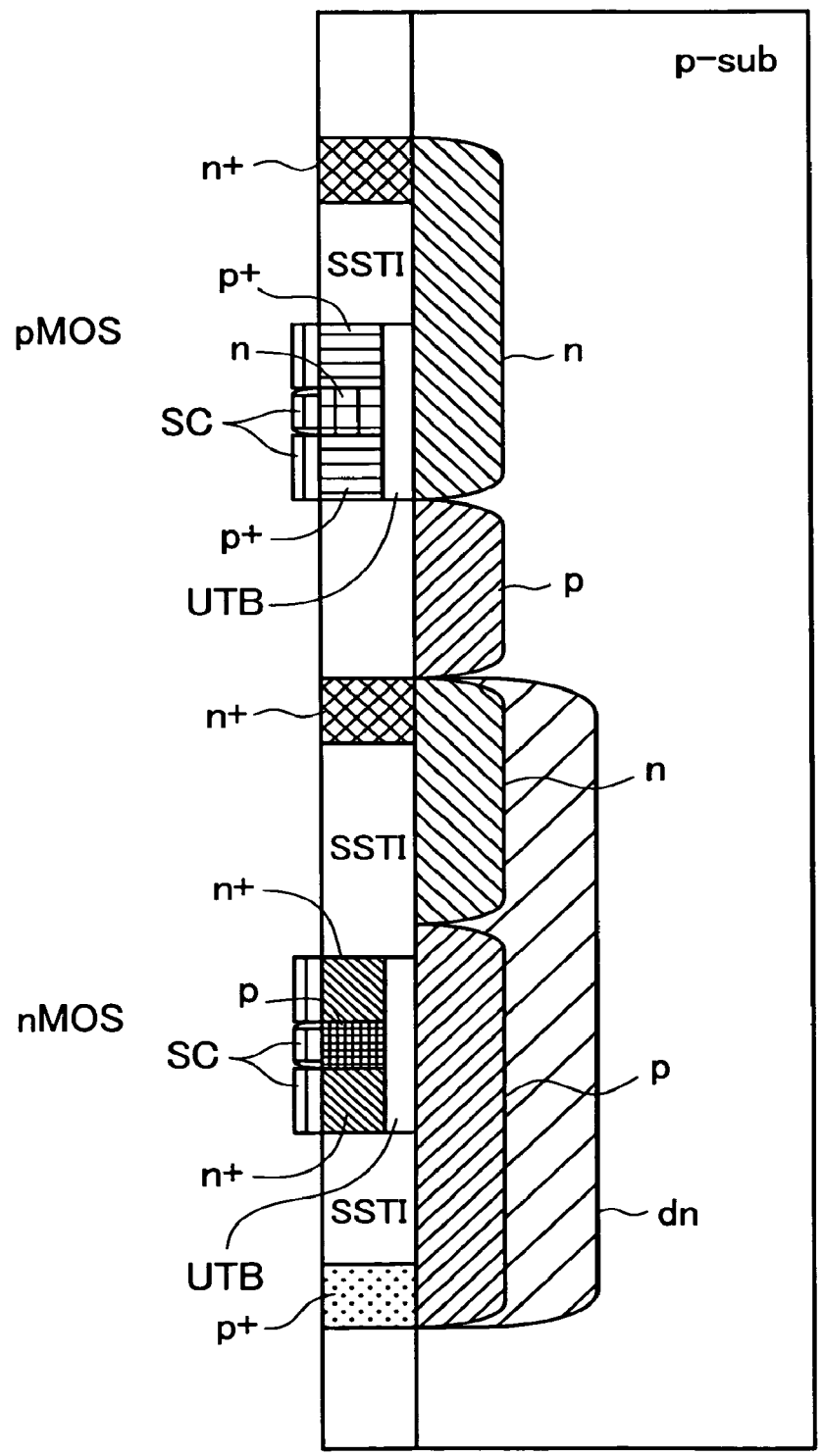
FIG. 14 is a cross-sectional view illustrating an example of the CMOS.

FIG. 13 and FIG. 14 are views illustrating other structures. Only differences from the structure shown in FIG. 12B will be described herein. FIG. 12 shows that the nMOS transistor and the pMOS transistor are separated from each other by the trench type insulating region STI. FIG. 13, however, shows that only a SSTI is used as a trench type insulating region. With this structure, in the nMOS transistor, the back gate portion is entirely covered by the dn region. By adopting this structure, with respect to regions under the UTB, the dn region in the nMOS transistor and the n region in the pMOS transistor are separated from each other by the p-substrate which is a p region. The UTB and regions above the UTB are separated from the SSTI. As a result, the structure according to the present invention can be realized without forming a STI region. FIG. 14 illustrates an example in which the p region is formed when a p region used for a back gate region of the nMOS transistor is formed between the do region of the nMOS transistor and the n region of the pMOS region. With this formation, the nMOS transistor and the pMOS transistor can be arranged closer to each other.

Figure 15:
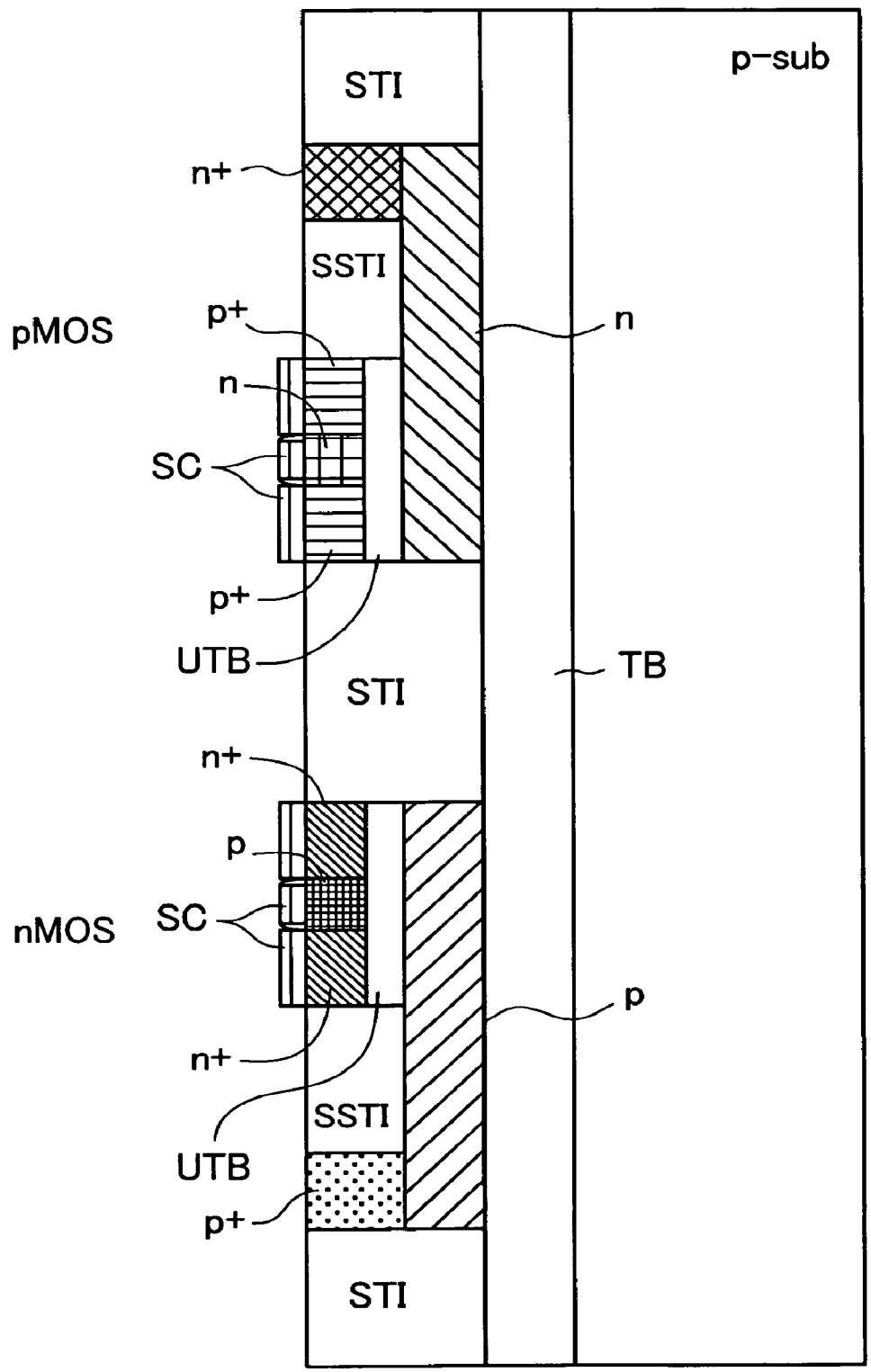
FIG. 15 is a cross-sectional view illustrating an example of the CMOS.

FIG. 15 is a view illustrating another example of a CMOS structure according to the present invention. In this structure, the back gate portions and the p-substrate are separated from each other by a TB which is an embedded oxide film. The back gate, which is a p region, is provided under the oxide film UTB in the nMOS transistor, while the back gate, which is an n region, is provided under the oxide film UTB in the pMOS transistor. The p region back gate in the nMOS transistor is led out up to a surface of the semiconductor in the p+ region, while the n region back gate in the pMOS transistor is led out up to a surface of the semiconductor in the n+ region. It is not necessary to provide an n region to separate the p region back gate and the p substrate in the nMOS transistor. In this embodiment, the nMOS transistor and the pMOS transistor can be provided closer to each other, making it possible to realize a semiconductor device with a smaller area.

Figure 16:
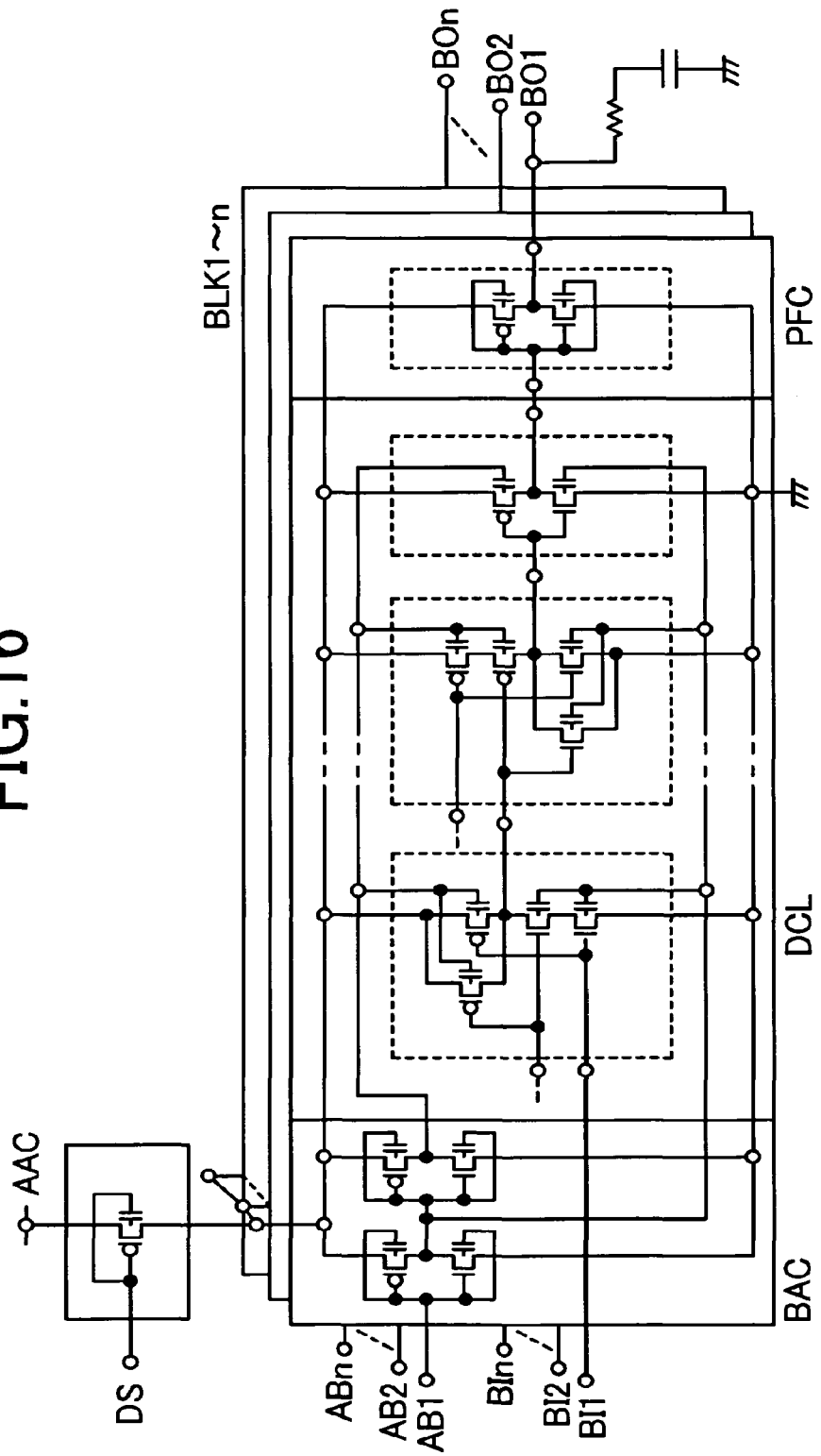
FIG. 16 is a circuit diagram illustrating a sixth embodiment of the present invention.

FIG. 16 is a view illustrating another configuration according to the present invention. This configuration is different from that shown in FIG. 1 and FIG. 4 in that there are a plurality of circuit blocks, each including the BAC block, the DCL block, and the PFC block as a set, and power terminals of the plurality of circuit blocks are generically denoted by AAC which is a switch connected to a power source. Also, a MOS transistor having the structure shown, for instance, in FIG. 3 is used for the switch AAC, of which the gate and the back gate are connected to each other. With the configuration described above, a current required for driving the circuit block including the BAC, the DCL, and the PFC as a set can be supplied by the MOS transistor which connects with the gate and the back gate of the switch AAC. Furthermore, a leakage current during the standby state can be suppressed to an extremely low level. Sign DS denotes a control signal for the switch ACC. In FIG. 16, a portion including the BAC block, the DCL block, and the PFC block as a set is denoted by BLK, which has n blocks. These n blocks are connected to the same AAC switch, and this unit is referred to as "AREA" in the following description. Signals which activate each of the blocks are denoted by AB1 to ABn.

FIG. 17 is a view illustrating an example of the operations of the system shown in FIG. 16. At first, a voltage DS is switched from a high level to a low level. As a result, the pMOS transistor having the switch AAC is in its ON state as shown in FIG. 16. Then, the region AREA and the power source are connected to each other to be in the activation state. This state is referred to as AREA ACTIVE in the following description. When this step is completed, only required blocks are activated by AB1 to ABn corresponding to those blocks. FIG. 17 is a view illustrating in which only the signal AB1 is selected. The level of the signal AB1 is switched from a high level to a low level, and a threshold voltage for the MOS transistor in the DCL in the block BLK 1 becomes smaller, resulting in a high speed operation. Then the input signal BI1 is validated, and a result of the operation is outputted to the output terminal BO1. To inactivate the block BLK, the signal AB1 is again returned to a high level. This causes a threshold value for the MOS transistor in the DCL to be set at a high value, and the standby state is effective (denoted as BLK Stand-by in the figure). In this state, a leakage current is small, but voltage signals to each node do not change, so that the operable state is immediately effective when the signal AB1 is switched again. As described above, this is one of the features of the present invention in which the operable state or the activate state is immediately effective from the standby state or from the inactivated state. To set the state of the entire region AREA to the standby state or the inactivated state, it is necessary only to switch the voltage DS again.

FIG. 18 illustrates a material for a gate electrode and a material for a gate oxide film used in the MOS transistor according to the present invention. FIG. 18A illustrates an example of a structure of an nMOS transistor. As shown in table 18B, the material for the gate electrode SC is not always limited to the salicide structure as shown in FIG. 18A, and any metallic material may be selected for the gate. This material is determined depending on a value of a target threshold voltage. Control is provided by the back gate mainly based on the threshold value decided according to the material. For the material for the gate oxide film, a material referred to as High-K film is shown in the table. Generally, when any of the materials shown in the table is used for the gate electrode, the threshold value is decided by the material. It is generally said that the threshold value changes little even when the High-K film is used, so that the advantage of the High-k film can be utilized.

Figure 19:
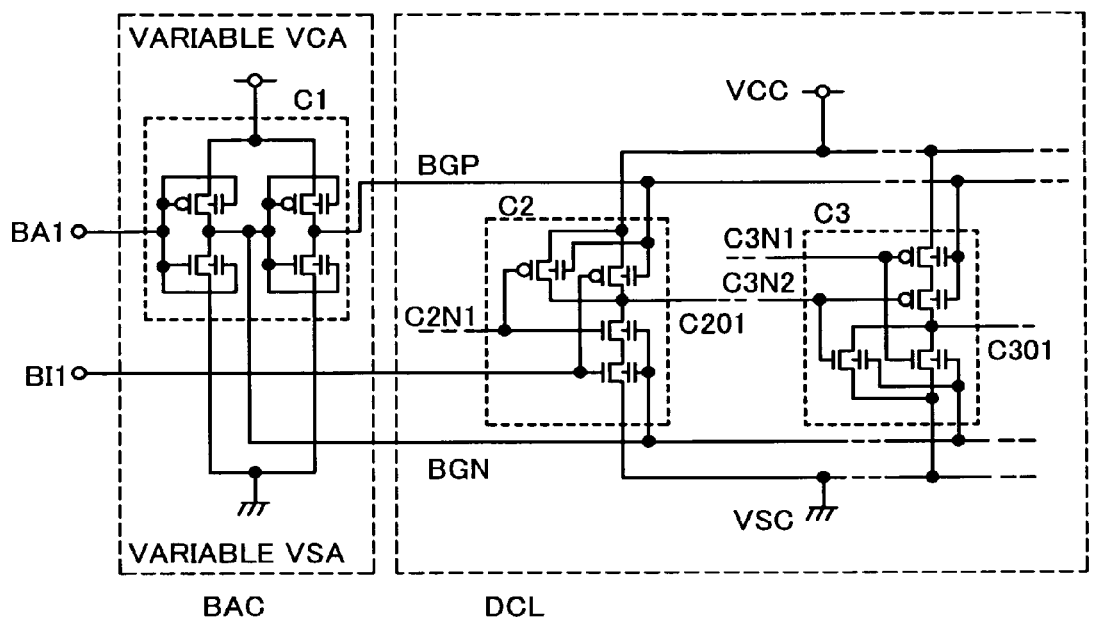
FIG. 19 is a circuit diagram illustrating a seventh embodiment of the present invention.
Figure 20A:
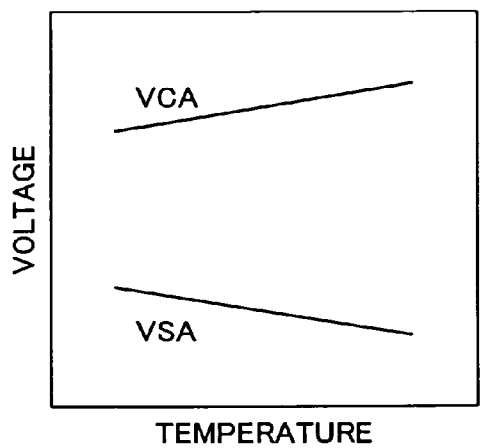
FIGS. 20A and 20B illustrate an example of control in FIG. 19.
Figure 20B:
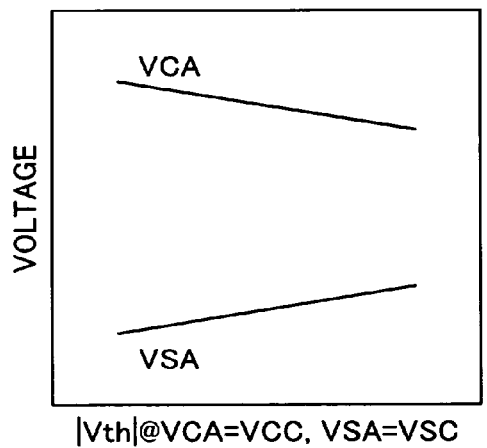

FIG. 19 is a view illustrating another embodiment of the present invention, and shows only portions of the block BAC and the DCL. This embodiment is characterized in that the voltages VCA and VSA can be changed according to an operating temperature or requirements for manufacturing. With this feature, as shown in FIG. 20A, as the temperature increases, for example, as the voltage VCA is higher and the voltage VSA is lower, the characteristic change of the DCL due to the change in temperature can be reduced. The threshold voltage is roughly decided by a material for the gate. However, the value varies based on non-uniformity in manufacturing the same. As shown in FIG. 20B, a voltage for canceling the non-uniformity can be generated.

Figure 21A:
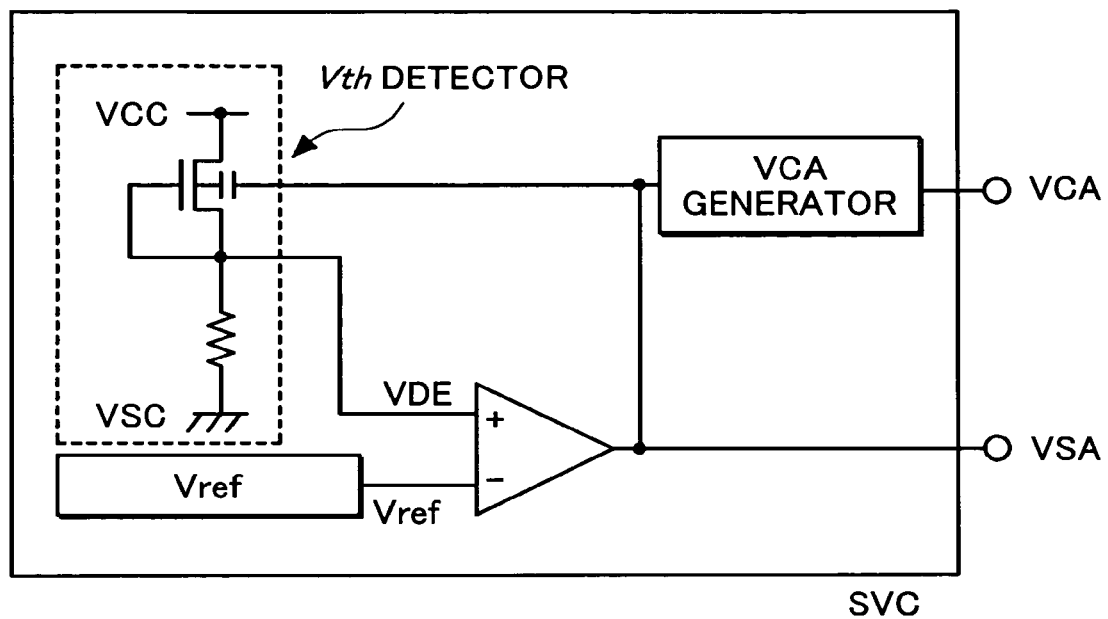
FIG. 21A is a circuit diagram illustrating an example of a circuit SCV for detecting change or non-uniformity in temperature and generating a voltage for correcting the change or non-uniformity.
Figure 21B:
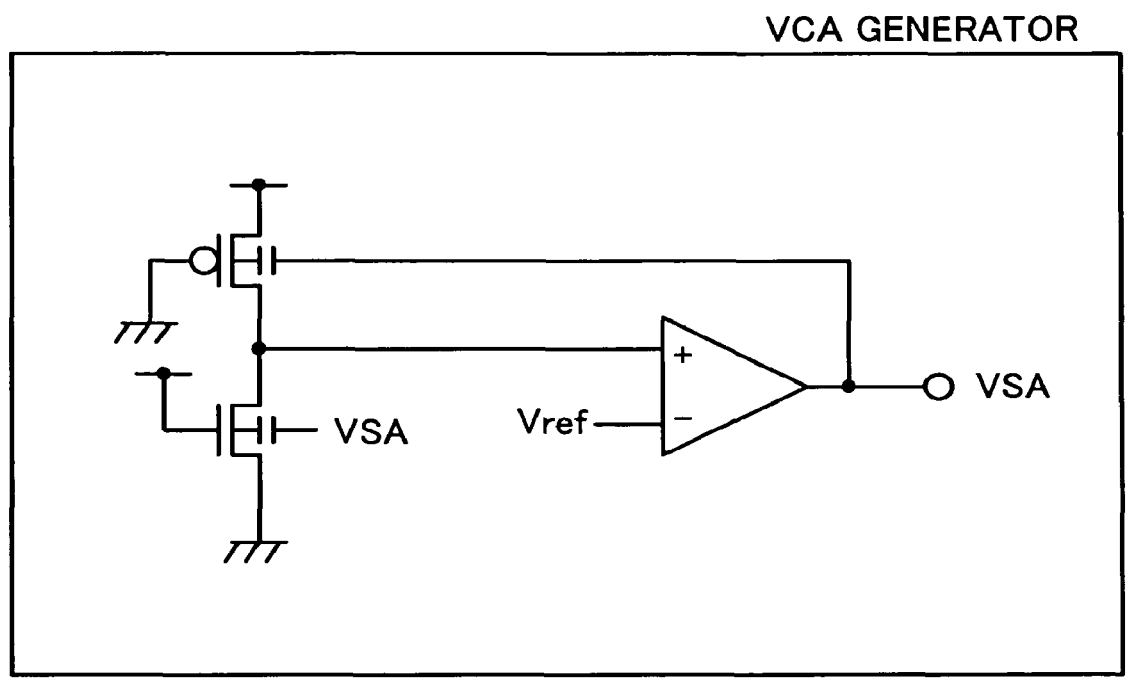
FIG. 21B is a circuit diagram illustrating an example of a VCA generator circuit constituting a portion of the configuration shown in FIG. 21A.

FIGS. 21A and 21B are views each showing an example of a circuit SVC for detecting the temperature change and non-uniformity or generating a voltage for correcting the change or the non-uniformity. A MOS transistor provided inside a Vth detector has a structure according to the present invention, and monitors a current through therein and generates a voltage VDE decided by the resistance. In this example, a band gap generator is used in this example as a unit for generating a reference voltage. VBG denote a voltage generated by the band gap generator. The resistance in the Vth detector and the size of the MOS transistor are adjusted to change the voltage VDE at a level close to the voltage VGB. By detecting a difference between the voltage VDE and the voltage VBG, the voltage VCA can be generated so that a constant voltage is provided irrespective of change in temperature and the non-uniformity generated in the manufacturing step. The voltage VSA can be generated in a VSA generator based on a change in this voltage VCA.

Figure 22:
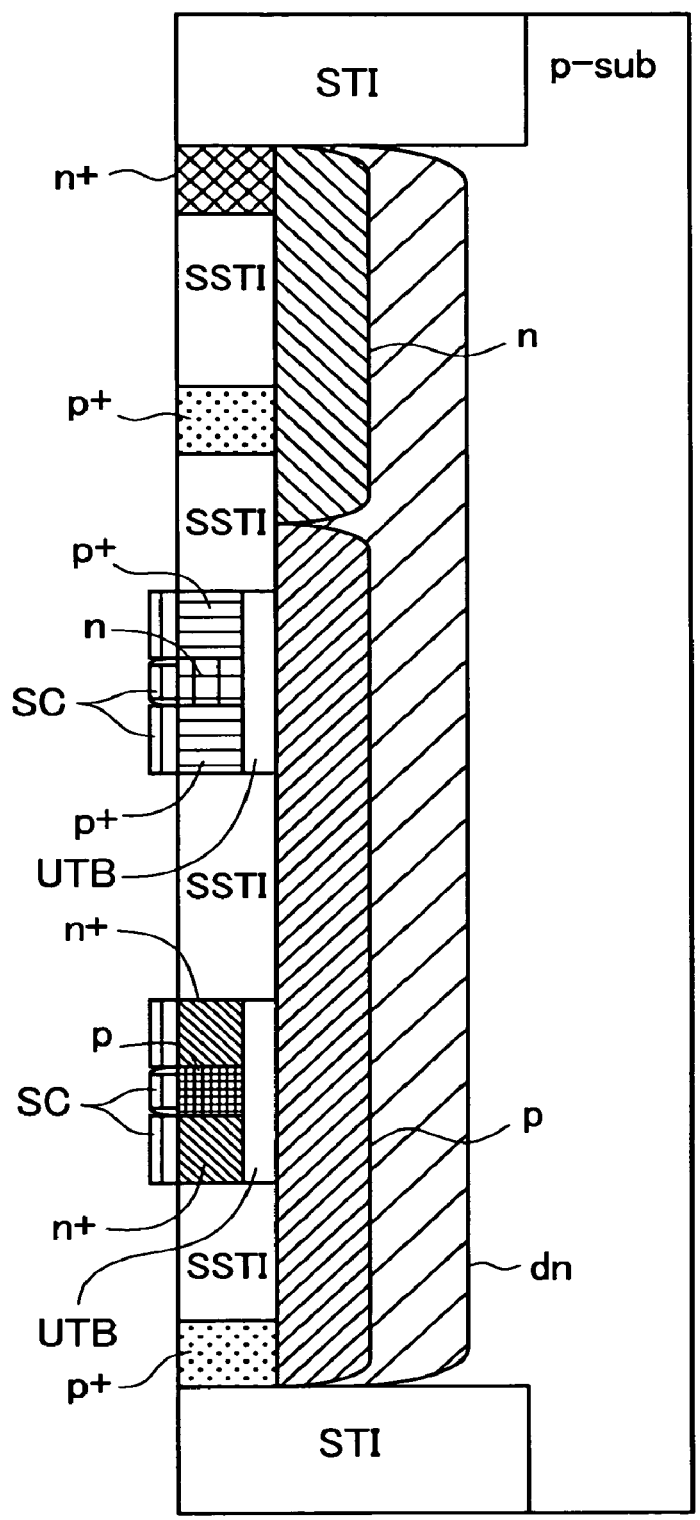
FIG. 22 is a cross-sectional view illustrating an example of the CMOS.

FIG. 22 illustrates an embodiment of the present invention for realizing a semiconductor with a smaller area. Only differences between the configuration shown in FIG. 22 and that shown in FIG. 12 will be described below. The embodiment shown in FIG. 22 is characterized in that the nMOS transistor and the pMOS transistor are provided in the do region, and the back gate is shared by the MOS transistor and the pMOS transistor. In other words, the p region, which is a back gate for the nMOS transistor shown in FIG. 12, is used also as a back gate for the pMOS transistor. With this configuration, the STI for separation of the nMOS transistor from the pMOS transistor is not required. This configuration is effective for producing a semiconductor device with a small area, such as a memory cell.

Figure 23:
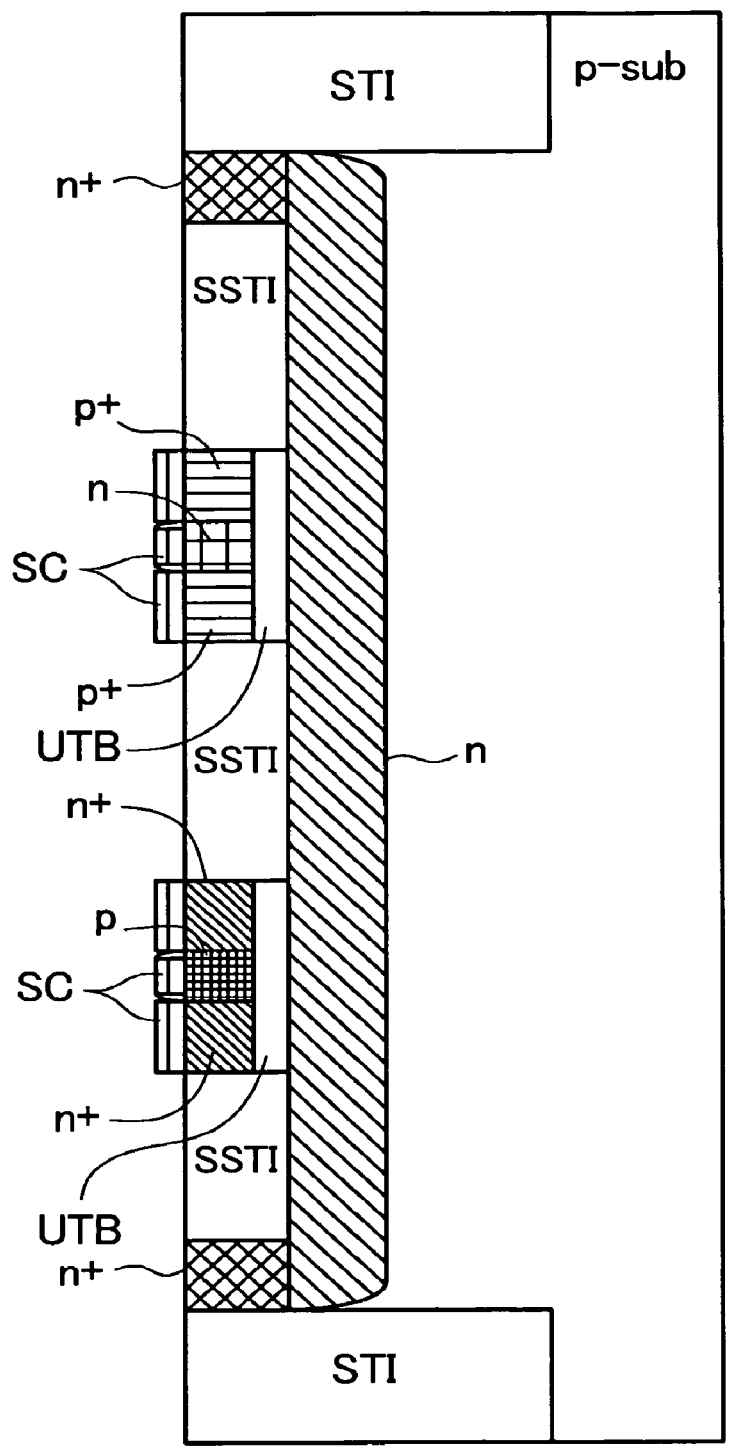
FIG. 23 is a cross-sectional view illustrating an example of the CMOS.

FIG. 23 illustrates an example different from that shown in FIG. 22. In this case, the n region, which is a back gate for the pMOS transistor shown in FIG. 12, is used also as a back gate for the nMOS transistor. This configuration is also effective for producing a memory cell or the like since a semiconductor with a small area can be realized.

Figure 24:
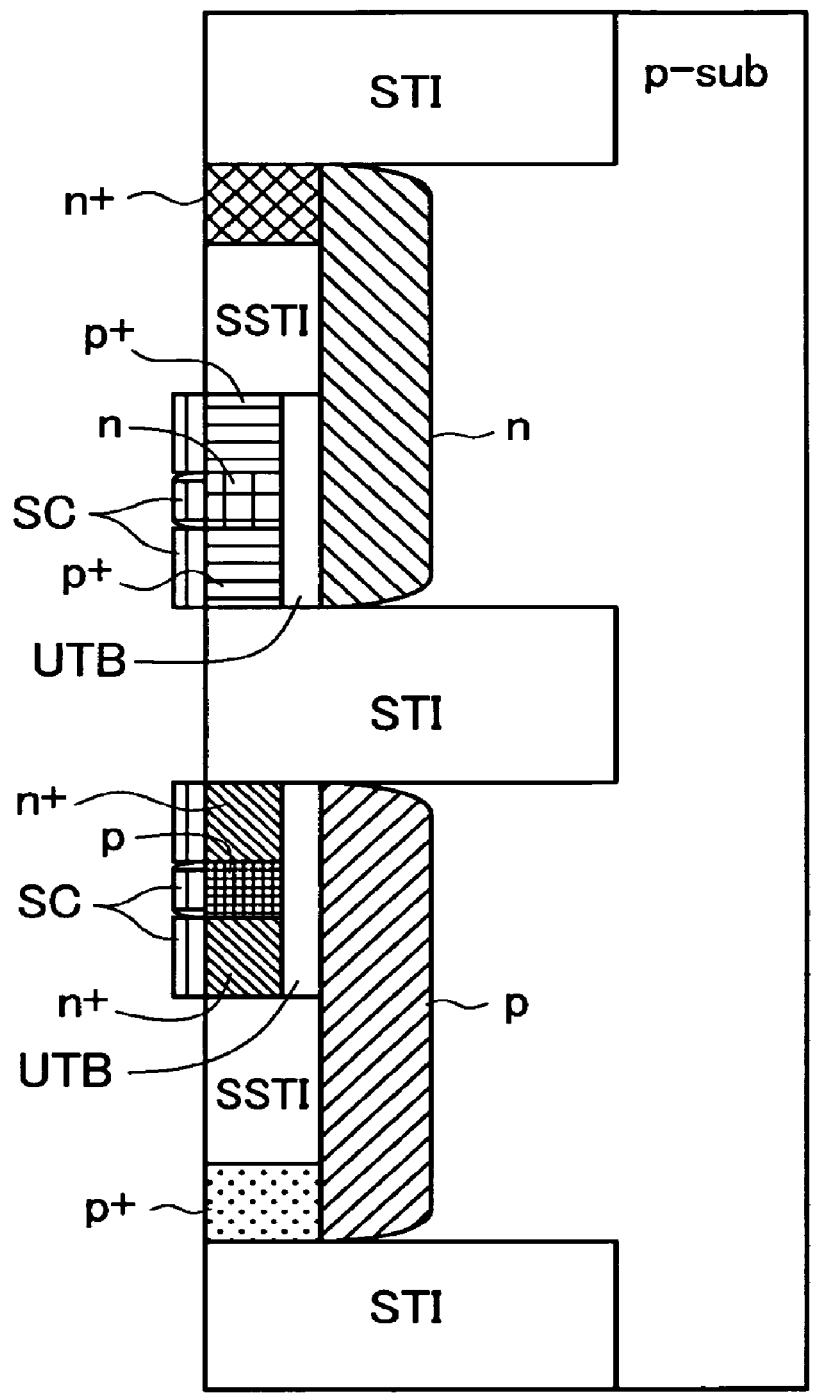
FIG. 24 is a cross-sectional view illustrating an example of the CMOS.

FIG. 24 illustrates a configuration in which the p region which is a back gate for the nMOS transistor is not separated from the p substrate region. First, this configuration may be used for using an asset of the conventional technology such as layout data or circuits produced in bulk. Secondly, since this configuration enables control over a back gate of the pMOS transistor, this configuration can be used for excellent applications when it is used for only controlling the back gate of the pMOS transistor. Namely, this configuration is effective in a memory cell or a pass gate logic circuit.

FIG. 25 to FIG. 28 illustrates examples of memory cells.

Figure 25:
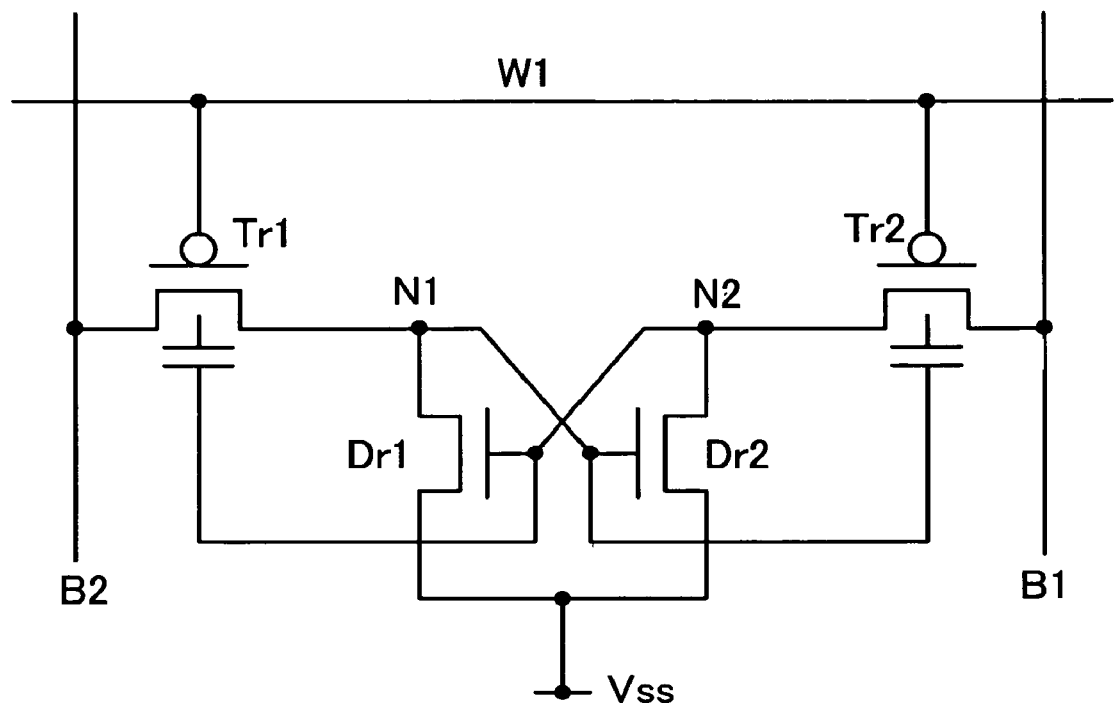
FIG. 25 is a circuit diagram illustrating an example of an SRAM circuit formed with four transistors.

FIG. 25 is a view illustrating an example of an SRAM configured with four transistors of Tr1, Tr2, Dr1, and Dr2. Back gates of the transistors Tr1 and Tr2 are controlled by the internal nodes N1 and N2 of the memory cell. B1 and B2 denote bit lines. W1 denotes a word line. In this configuration, a threshold voltage for necessary one of the MOS transistors Tr1 and Tr2 can be set at a high value, and a threshold voltage for the other one can be set at a low value. This enables reduction of the power required for the memory cell.

Figure 26:
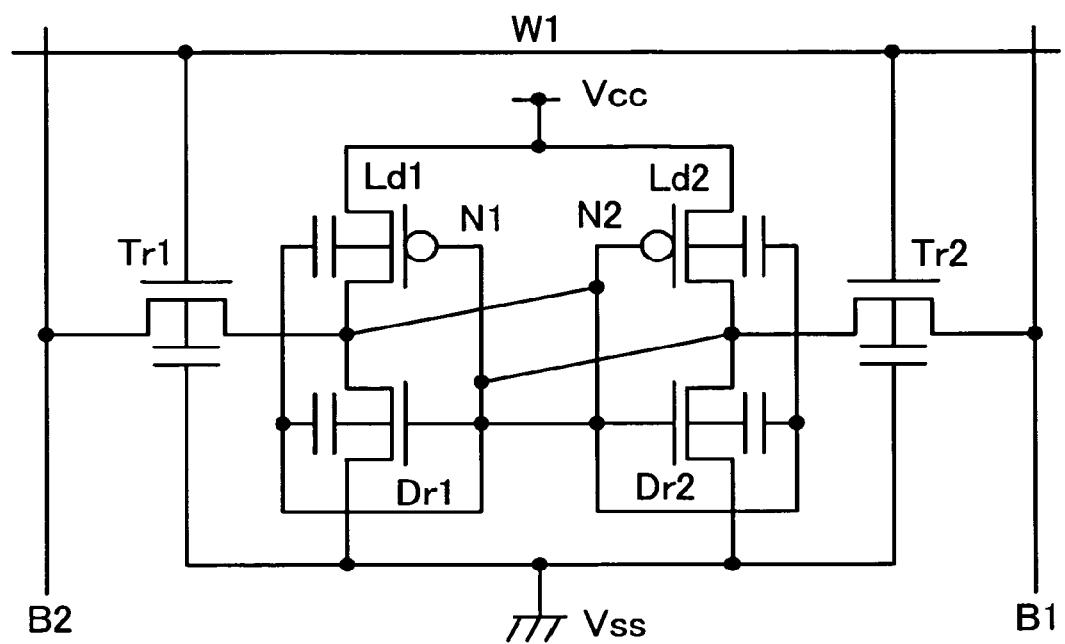
FIG. 26 is a circuit diagram illustrating an example of the SRAM circuit formed with six transistors.

FIG. 26 is a view illustrating an example of an SRAM configured with six transistors of Tr1, Tr2, Ld1, Ld2, Dr1, and Dr2. In this configuration, back gates of the transistors Ld1 and Dr1 are connected to the gates thereof, and back gates of the transistors Ld2 and Dr2 are connected to the gates thereof. The configuration enables stability of this memory cell to be improved.

Figure 27:
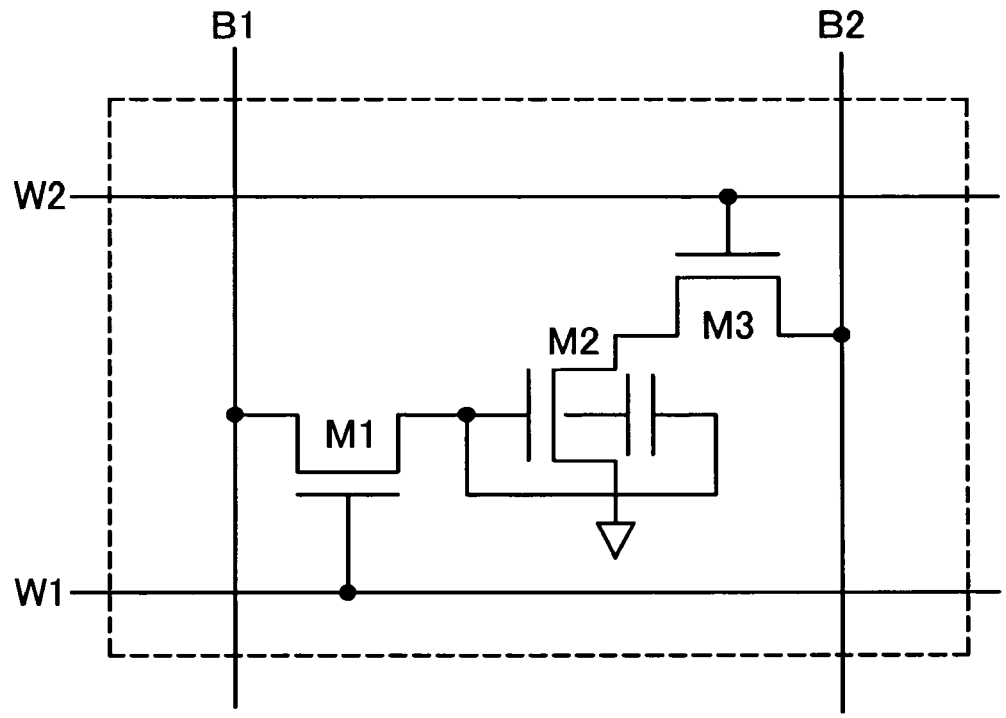
FIG. 27 is a circuit diagram illustrating an example of a DRAM circuit formed with three transistors.

FIG. 27 is a view illustrating an embodiment according to the present invention applied to a DRAM configured with three transistors. In the case shown in FIG. 27, information is stored depending on whether an electric charge is present at a gate of a transistor M2. The M1 is a transistor which writes information in the memory cell by storing electric charges in a gate of the transistor M2 or removing the electric charges from the gate of M2. A gate signal path W1 connected to the transistor M1 is referred to as a write word line, and B1 connected to either one of the source/train terminals of the transistor M1 is referred to as a write lit-line. A level of a current which can flow through the transistor M2 varies depending on whether or not an electric charge is present on the gate, and the information is selectively read by a transistor M3 serially connected to the transistor M2. A gate signal line W2 connected with this transistor M3 is referred to as a read bit-line, while the bit line B2 connected to the drain terminal of the transistor M3 is referred to as a write bit-line. In the case shown in FIG. 27, the gate and the back gate are connected in the transistor M2. In the configuration, when an electric charge is present at the gate of the transistor M2, the voltage is high. Thus, a threshold voltage for the transistor M2 decreases, which enables a large drain current to flow in the transistor M2. On the other hand, when there is no electric charge at the gate of the transistor M2, the threshold voltage is low. Thus, the threshold voltage for the transistor M2 rises and only a small current can flow in the transistor M2. Accordingly, the current difference due to the difference of information can be increased as compared to that when the control described above is not performed.

Figure 28:
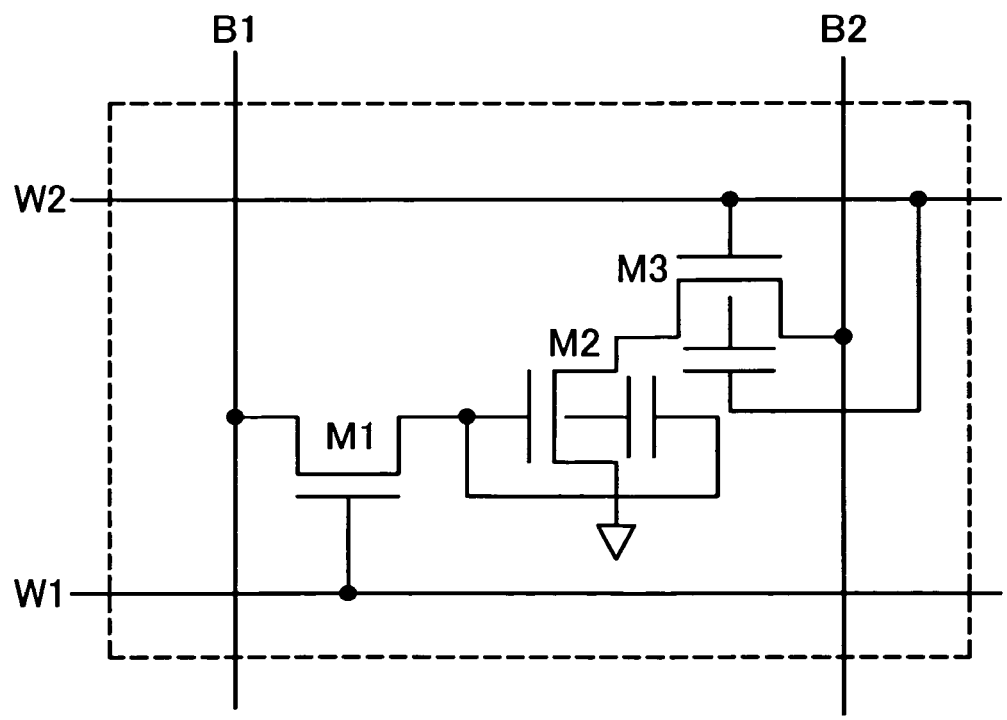
FIG. 28 is a circuit diagram illustrating an example of a DRAM circuit formed with three transistors.

FIG. 28 illustrates another embodiment. Only the difference between the configuration shown in FIG. 28 and that shown in FIG. 27 will be described here. In this embodiment, a gate is connected to a back gate not only in the transistor M2, but also in the transistor M3. With the configuration, a large current can flow during an operation for reading data. Since the transistor M1 is used for charging or discharging a gate of the transistor M2, only the small driving capability is required. However, large driving capability is required for the transistor M3 to read out information. In the case where the present invention is not used, the size of the transistor M3 needs to be increased to enable a larger current to flow. This is not preferable since a larger area of the memory cell is required.

FIGS. 29 to 31A and 31B are views each illustrating embodiments of a combination of any of the logic circuits described above and a memory cell system, and show components provided on a semiconductor device. In the figures, only portions and components necessary for description are shown, and it is to be noted that other devices such as IO circuits, sensors, components for radio communications, and nonvolatile memories may be provided if necessary.

Figure 29:
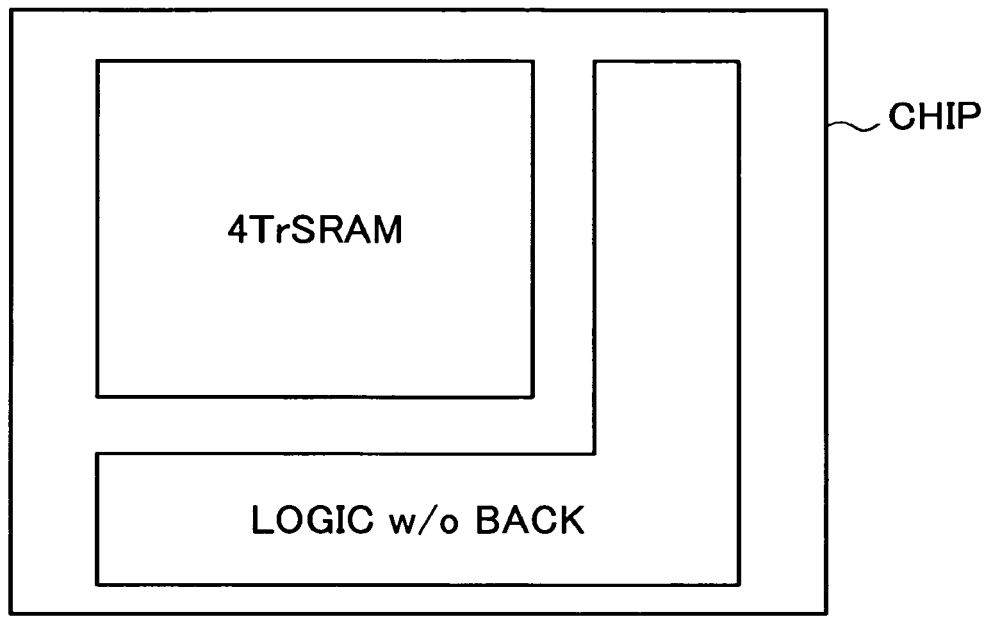
FIG. 29 is a diagram illustrating an example of arrangement of a logic circuit and a memory.

FIG. 29 is a view illustrating a configuration in which back gate control for the logic circuit is not performed, but back gate control for the memory is performed. In FIG. 29, a memory cell configured with four transistors as shown in FIG. 25 is used. 4TrSRAM denotes a memory portion configured with the four transistors and in a memory cell. Logic W/O Back denotes the logic circuit portion. With the configuration, the cross-sectional structure can be simplified, resulting in reduction of the cost. In other words, the structure shown in FIG. 23 is used for the memory portion, and the structure shown in FIG. 24 is used for the logic portion. The same process is performed in the two structures.

Figure 30:
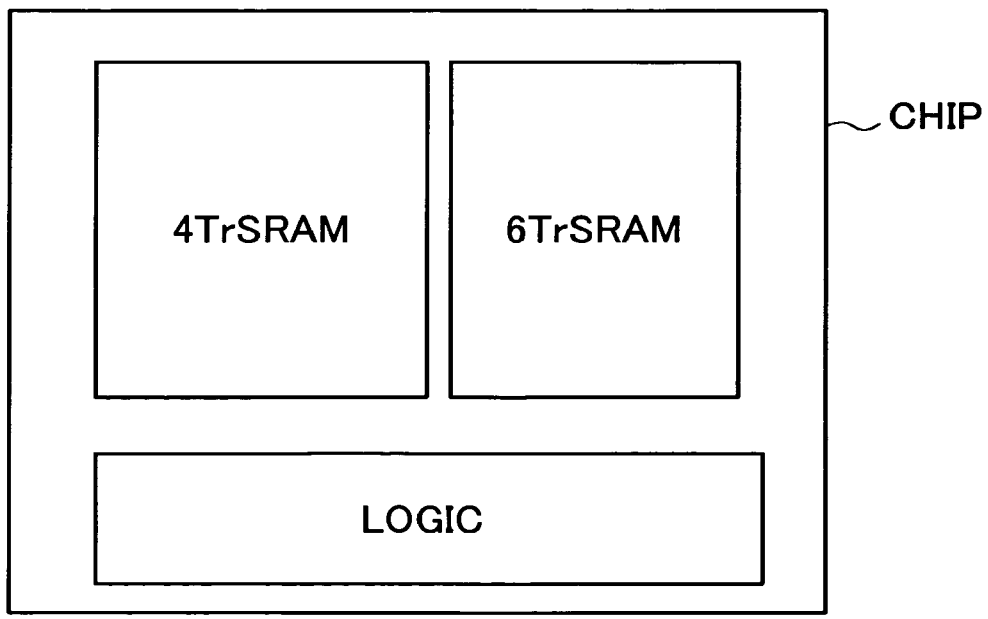
FIG. 30 is a diagram illustrating an example of arrangement of a logic circuit and a memory.

FIG. 30 is a view illustrating an embodiment in which back gate control is performed for the logic portion. The memory portion (4TrSRAM) having a memory cell configured with four transistors and a memory portion (6TrSRAM) having a memory cell configured with 6 transistors as shown, for instance, in FIG. 26 are provided on a chip. Furthermore, a circuit for back gate control as shown, for instance, in FIG. 1 is provided on the logic circuit portion. The memory portion 6TrSRAM is used as a cache memory. The memory portion 4TrSRAM can be used as a work memory (since the number of transistors in the memory portion 4TrSRAM is smaller than that of the memory portion 6TrSRAM). When the memory portion 4TrSRAM having a small area is used, the performance of the entire semiconductor device can be improved. By using the configuration in the example described above, a logic circuit with the high processing performance and low power consumption, and a memory with a small area and low power consumption, which is required for operations of the logic circuit, can be realized.

Figure 31A:
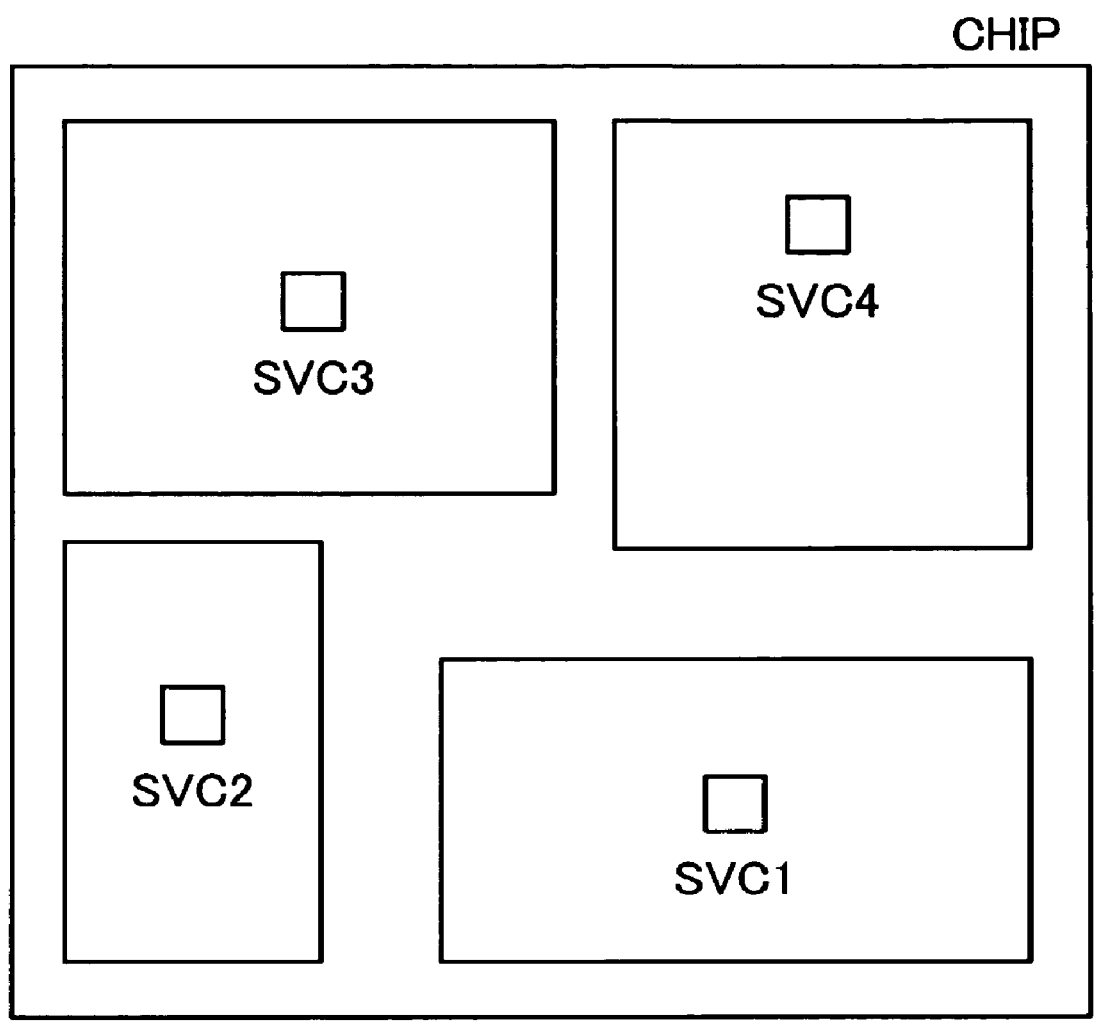
FIG. 31A is a diagram illustrating an embodiment of the present invention in which a plurality of SVC circuits each for detecting change of non-uniformity in temperature and generating a voltage for correcting the change or non-uniformity are provided on the same chip.
Figure 31B:
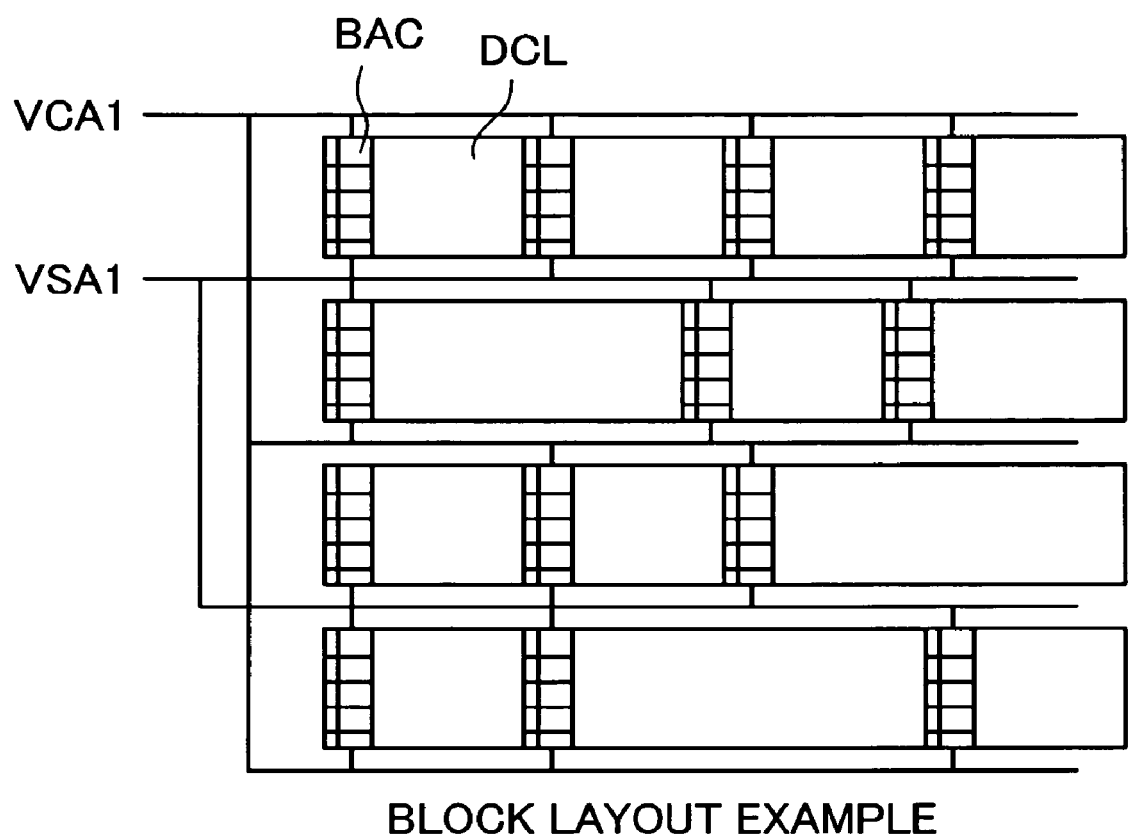
FIG. 31B is a block diagram illustrating an example of a configuration of the SVC1 shown in FIG. 31A.

FIG. 31A is a view illustrating a configuration in which a plurality of circuits SVC are provided on one chip. Each of the circuits detect a change in temperature or non-uniformity as described with reference to FIG. 21A and generate a voltage for correcting the change or the non-uniformity. In this configuration, by providing the circuit SVC on each region or on each circuit which can be regarded as homogeneous on the chip, more meticulous control can be provided. In this example, a surface of the chip is divided to four regions, and the voltage VCA and the voltage VSA suitable for each of the circuits SVC1 to SVC4 are generated. For instance, as shown in FIG. 31B, the voltages VCA1 and VSA1 are generated in the circuit SVC1, and the voltages are supplied to the block BAC and the block DCL in the region as shown in the example of block arrangement.

Figure 32:
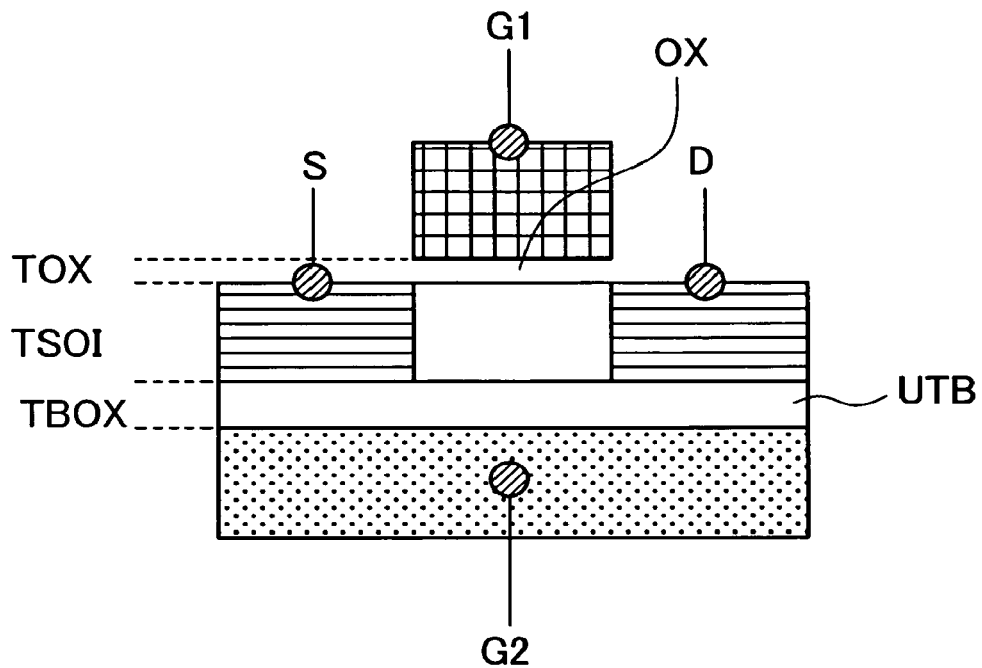
FIG. 32 illustrates a structure having a back gate.
Figure 33:
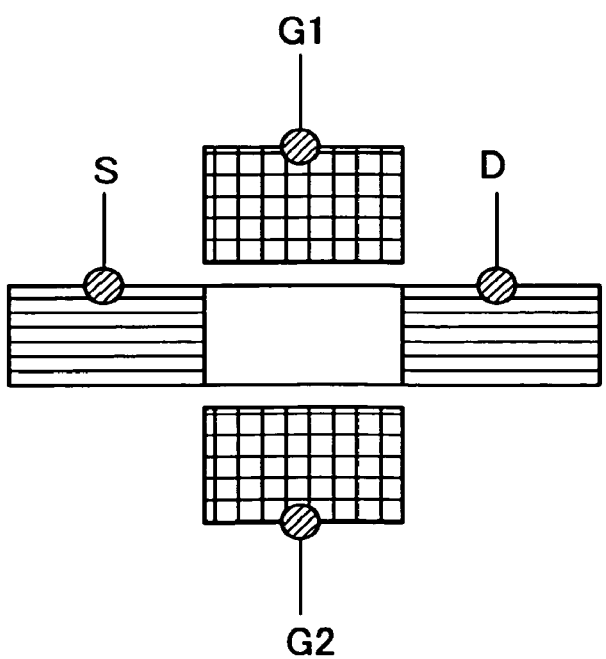
FIG. 33 illustrates another example of a structure having a back gate.
Figure 34:
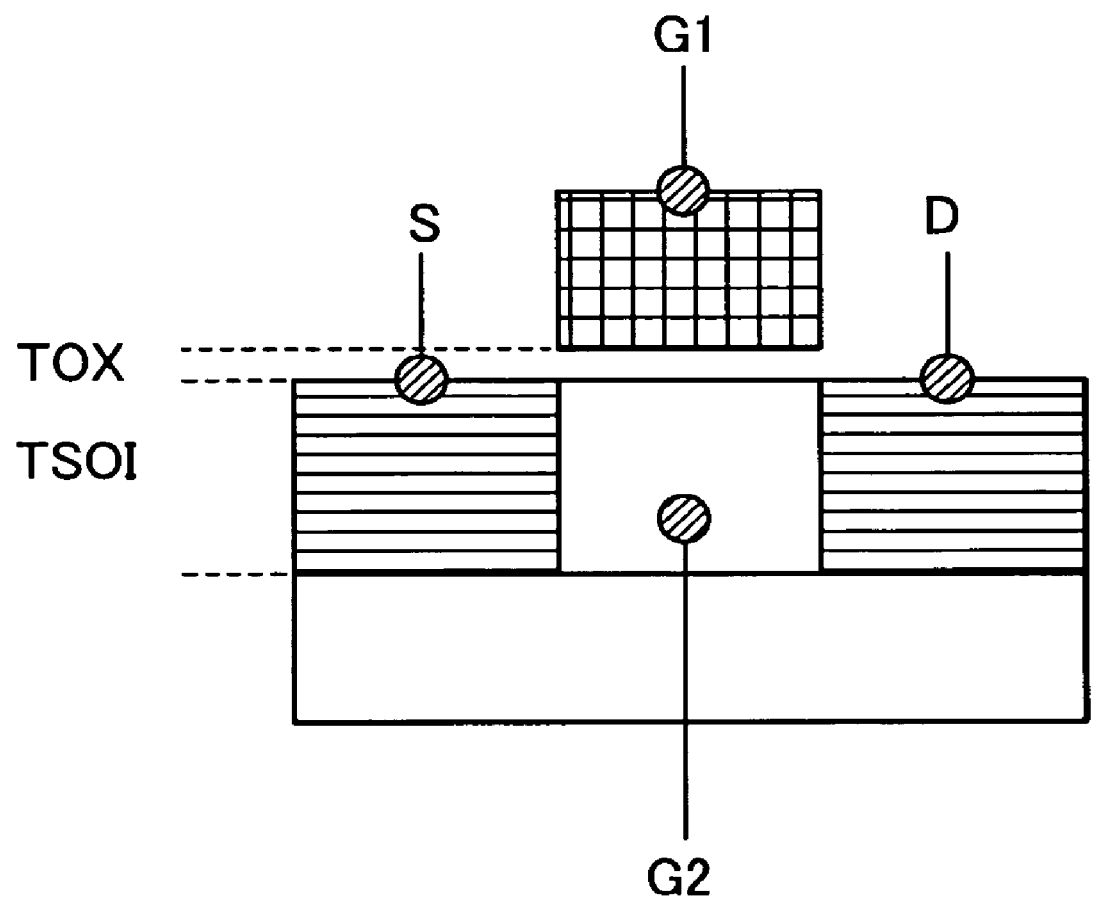
FIG. 34 illustrates a structure of a PD-SOI by way of example.

FIGS. 32 to 34 are views each illustrating an example of back gate control.

FIG. 32 is a view exemplarily showing a structure used in the present invention. A MOS transistor having a source terminal S, a drain terminal D, a gate G1, and gate oxide film OX are provided on an embedded oxide film UTB, forming the structure SOI. A semiconductor portion of the substrate under the oxide film UTB is used as a back gate G2. TOX denotes a thickness of a gate oxide film OX. TSOI denotes a thickness of the source terminal S and a thickness of the drain terminal D. TBOX denotes a thickness of the embedded oxide film UTB. Excluding the case in which the High-K film is used, the thickness TOX is 2 nm or below, the thickness TSOI is around 20 nm, and the thickness TBOX is in the range from 10 to 20 nm.

FIG. 33 is a view illustrating another structure. In this structure, the back gate G2 is formed with the conductive material similar to that of the gate G1. The back gate G2 can be produced with high accuracy although positional misalignment between the back gate G1 and the gate G1 in the vertical direction should be prevented.

FIG. 34 is a view illustrating an example of the structure in which the TSOI is thick, the TSOI being referred to as PD-SOI. This structure is referred to as a partially depleted type. In this structure, the terminal providing an electrical potential to a region under the gate is the back gate G2 as shown in FIG. 34. The potential is given to the back gate G2 on the condition that the PN junction between the source terminal S and the region under the gate is not turned ON.

References used in the drawings for this patent application will be described below.

DCL: logic circuit block
BAC: Circuit block for generating back gate control signal
PFC: Output buffer circuit block
UTB: Embedded oxide film
OX: gate oxide film
ST1: Trench type insulating region
SSTI: Trench type insulating region (with a smaller depth as compared to the region STI):
TB: Embedded oxide film (under the oxide film UTB)

What is claimed is:
1. A semiconductor device comprising:
a first completely-depleted type SOI/MOS transistor provided on a first embedded oxide film formed on a semiconductor substrate; and
a second completely-depleted type SOI/MOS transistor provided on the first embedded oxide film (TB),
wherein the first completely-depleted type SOI/MOS transistor comprises (pMOS)
a first semiconductor layer selectively formed on the first embedded oxide film via a second embedded oxide film;
a first source region and a first drain region having a first conductive type formed on the first semiconductor layer and having a same thickness as that of the first semiconductor layer;
a first channel region having a second conductive type opposite to the first conductive type formed between the first source region and the first drain region having the first conductive type;
a first gate formed on a first main surface of the first channel region;
a second gate comprising a conductive layer having the second conductive type formed on the first embedded oxide film in contact with a bottom of the second embedded oxide film;
a first insulating separating layer formed on the first embedded oxide film so as to surround the first semiconductor layer;
a first diffusion layer having the second conductive type selectively formed on the second gate; and
a second insulating separating layer formed on the second gate in contact with the second embedded oxide film so as to separate the first diffusion layer and the first semiconductor layer,
wherein the second completely-depleted type SOI/MOS transistor comprises
a second semiconductor layer selectively formed on the first embedded oxide film via a third embedded oxide film;
a second source region and a second drain region having a second conductive type formed on the second semiconductor layer and having a same thickness as that of the second semiconductor layer;
a second channel region having the first conductive type formed between the second source region and the second drain region having the second conductive type;
a third gate formed on a first main surface of the second channel region;
a fourth gate comprising a conductive layer having the first conductive type formed on the first embedded oxide film in contact with a bottom of the third embedded oxide film);

a third insulating separating layer formed on the first embedded oxide film so as to surround the second semiconductor layer;

a second diffusion layer having the first conductive type selectively formed on the fourth gate; and a fourth insulating separating layer formed on the fourth gate in contact with the third embedded oxide film so as to separate the second diffusion layer and the second semiconductor layer, wherein each of the second and the fourth insulating separating layers is a trench type insulation region with a depth smaller than that of the first and the third insulating separating layer, respectively.

2. The semiconductor device according to claim 1, wherein each of the first gate and third gate is composed of a gate oxide and a material formed on the gate oxide, and wherein the material is either nickel silicide, titanium nitride, or tantalium silicon nitride.

3. The semiconductor device according to claim 1, wherein each of the first gate and third gate is composed of a gate oxide and a material formed on the gate oxide, and wherein the gate oxide is either zirconium dioxide, halfnium oxide, titanium dioxide, or tantalium pentoxide.

* * * * *